(12) United States Patent
Hirano et al.

(10) Patent No.: US 8,871,567 B2
(45) Date of Patent: Oct. 28, 2014

(54) FIELD-EFFECT TRANSISTOR AND METHOD FOR MANUFACTURING THE SAME

(75) Inventors: Koichi Hirano, Osaka (JP); Shingo Komatsu, Osaka (JP); Yasuteru Saito, Kyoto (JP); Naoki Ike, Kyoto (JP)

(73) Assignees: Panasonic Corporation, Osaka (JP); Dai-Ichi Kogyo Seiyaku Co., Ltd., Kyoto (JP)

(*) Notice: Subject to any disclaimer, the term of this patent is extended or adjusted under 35 U.S.C. 154(b) by 32 days.

(21) Appl. No.: 13/641,793

(22) PCT Filed: Dec. 19, 2011

(86) PCT No.: PCT/JP2011/079979
§ 371 (c)(1),
(2), (4) Date: Oct. 17, 2012

(87) PCT Pub. No.: WO2012/090891
PCT Pub. Date: Jul. 5, 2012

(65) Prior Publication Data
US 2013/0032797 A1    Feb. 7, 2013

(30) Foreign Application Priority Data
Dec. 27, 2010  (JP) .................. 2010-290516

(51) Int. Cl.
H01L 21/336   (2006.01)
H01L 29/786   (2006.01)
H01L 29/66    (2006.01)

(52) U.S. Cl.
CPC ...... *H01L 29/7869* (2013.01); *H01L 29/66742* (2013.01); *H01L 29/78693* (2013.01)
USPC .............. 438/104; 257/143; 427/58

(58) Field of Classification Search
USPC ............................. 257/43; 438/104
See application file for complete search history.

(56) References Cited

U.S. PATENT DOCUMENTS

| | | | |
|---|---|---|---|
| 7,402,506 B2 | 7/2008 | Levy et al. | |
| 7,473,929 B2 * | 1/2009 | Kusumoto et al. | 257/77 |
| 7,649,215 B2 * | 1/2010 | Beach | 257/194 |
| 7,947,537 B2 | 5/2011 | Honda et al. | |
| 8,525,156 B2 * | 9/2013 | Nakamura et al. | 257/40 |
| 2008/0200636 A1 * | 8/2008 | Nakanishi et al. | 528/105 |
| 2009/0127551 A1 | 5/2009 | Imai | |
| 2013/0240871 A1 * | 9/2013 | Shimoda et al. | 257/43 |

FOREIGN PATENT DOCUMENTS

| | | |
|---|---|---|
| JP | 2003-183009 | 7/2003 |
| JP | 2008-544522 | 12/2008 |
| JP | 2010-147206 | 7/2010 |
| JP | 2010-283190 | 12/2010 |
| WO | 2009/081862 | 7/2009 |

OTHER PUBLICATIONS

International Search Report issued Mar. 6, 2012 in International (PCT) Application No. PCT/JP2011/079979.
Extended European Search Report mailed Feb. 4, 2014 issued in corresponding European Patent Application No. 11853548.3.
International Preliminary Report on Patentability and Written Opinion of the International Searching Authority issued Jul. 11, 2013 in International (PCT) Application No. PCT/JP2011/079979.

* cited by examiner

*Primary Examiner* — Zandra Smith
*Assistant Examiner* — Damian A Hillman
(74) *Attorney, Agent, or Firm* — Wenderoth, Lind & Ponack, L.L.P.

(57) ABSTRACT

The present invention achieves a formation of a metal oxide film of a thin film transistor with a simplified process. The present invention is concerned with a method for manufacturing a field-effect transistor comprising a gate electrode, a source electrode, a drain electrode, a channel layer and a gate insulating layer wherein the channel layer is formed by using a metal salt-containing composition comprising a metal salt, a polyvalent carboxylic acid having a cis-form structure of —C(COOH)═C(COOH)—, an organic solvent and a water wherein a molar ratio of the polyvalent carboxylic acid to the metal salt is in the range of 0.5 to 4.0.

21 Claims, 26 Drawing Sheets

(a) Present Invention

Example 47    Ra=0.11nm

5um square (b) Comparative example (No polyvalent carboxylic acid)

Comparative example 16

Ra=11.1nm

5um square

Channel length L/Channel width W= (L/W=)150/2000

Mobility: 4.4[cm²/Vs]

FIELD-EFFECT TRANSISTOR AND METHOD FOR MANUFACTURING THE SAME

CROSS REFERENCE TO RELATED PATENT APPLICATION

The present application claims the right of priority of Japan patent application No. 2010-290516 (filing date: Dec. 27, 2010, title of the invention: FIELD-EFFECT TRANSISTOR AND METHOD FOR MANUFACTURING THE SAME), the whole contents of which are incorporated herein by reference.

TECHNICAL FIELD

The present invention relates to a field-effect transistor, and also a method for manufacturing the same. More particularly, the present invention relates to a field-effect transistor which can be used as a TFT, and also the method for manufacturing the same.

BACKGROUND OF THE INVENTION

With a wide spreading use of information terminals, there is a growing need for a flat panel display for use in a computer. In this regard, a display medium of the flat panel display device is generally provided by using an element such as a liquid crystal, an organic EL (organic electroluminescence) and an electrophoresis. In such display medium, a technology using an active drive element (for example, a field-effect transistor like a TFT element) as an image drive element has been becoming a primary means to secure a uniformity of the screen luminosity, a screen rewriting speed and so forth. The term "TFT" is an abbreviation of "Thin Film Transistor". For example, the general display device for use in the computer is configured to have the TFT elements on a substrate where a liquid crystal element, an organic EL element or the like is sealed.

Although semiconductors such as a-Si (amorphous silicon) are mainly used in the TFT element, the a-Si can not exhibit a high mobility (for example, the mobility of the a-Si is no more than about 0.5). Accordingly, it is becoming difficult for such semiconductors to comply with the trend toward greater sizes and an improved high-speed driving of the display.

Under these circumstances, an oxide semiconductor is becoming an attractive semiconductor since it exhibits a high performance and can be produced without difficulty. In general, a vacuum processes (e.g., sputtering process and ALD process) and a solution processes are used to produce a metal oxide film. In this regard, a production of the oxide semiconductor has a tendency toward making use of the sputtering process.

PATENT DOCUMENTS (PRIOR ART PATENT DOCUMENTS)

Patent document 1: WO2009/081862
Patent document 2: Japanese Patent Kokai publication No. 2003-183009

SUMMARY OF THE INVENTION

Problems to be Solved by the Invention

If a thin film of the metal oxide can be formed by performing an application or printing of a precursor solution therefor, there is no need to use an expensive vacuum apparatus such as sputtering apparatus and PECVD (plasma CVD). Such utilization of the applying or printing of the raw materials in the production of the metal oxide film can lead to a simplified process, making it possible to manufacture the thin film transistor having a large area at a lower cost.

In this regard, although there is a so-called "solution process" which is considered as a relatively simple process, it is feasible only for the production of a particular metal salt such as alkoxide and acetate. Moreover, the solution process can not achieve the formation of a dense film with uniformity and flatness, and thus it is not suitable for the formation of a thin film transistor exhibiting a high performance.

The present invention has been created in view of the above circumstance. That is, one of the main object of the present invention is to provide a manufacturing method of a field-effect transistor (e.g., thin film transistor) wherein a film or layer thereof can be suitably formed, and also to provide a field-effect transistor having a high performance by such method.

Means for Solving the Problem

In order to achieve the above object, the present invention provides a method for manufacturing a field-effect transistor comprising a gate electrode, a source electrode, a drain electrode, a channel layer and a gate insulating layer,
wherein the channel layer is formed by using a metal salt-containing composition comprising:
  a metal salt;
  a polyvalent carboxylic acid having a cis-form structure of
    —C(COOH)=C(COOH)—;
  an organic solvent; and
  a water
wherein a molar ratio of the polyvalent carboxylic acid to the metal salt is in the range of 0.5 to 4.0.

The present invention is characterized in that the "metal salt-containing composition comprising a metal salt, a polyvalent carboxylic acid having a cis-form structure of —C(COOH)=C(COOH)— with a molar ratio of the polyvalent carboxylic acid to the metal salt being 0.5 to 4.0, an organic solvent and a water" is used for the formation of the channel layer of the field-effect transistor.

The term "field-effect transistor" used in the present description means a transistor wherein a conductance of a current passageway (i.e., channel) is controlled by an electric field derived from a gate electrode. Examples of such field-effect transistor may include a Thin Film Transistor (TFT).

In one preferred embodiment, the metal salt, which is contained in the metal salt-containing composition, is a salt of one or more metals selected from the group consisting of Mg, Ca, Sr, Ba, Y, Ti, Zr, Hf, Nb, Ta, Cr, W, Fe, Ni, Cu, Ag, Zn, Al, Ga, In, Sn and Sb. The metal salt may be in a form of one or more salts selected from the group consisting of nitrate, sulfate, carboxylate, halide, alkoxide and acetylacetonate.

Preferably, the metal salt, which is contained in the metal salt-containing composition, comprises at least Zn. In the case, it is more preferred that the metal salt of the metal salt-containing composition further comprises a salt of one or more metals selected from the group consisting of In and Ga.

In another preferred embodiment, the polyvalent carboxylic acid, which is contained in the metal salt-containing composition, is one or more carboxylic acids selected from the group consisting of maleic acid, citraconic acid, phthalic acid and trimellitic acid.

The water may have any suitable form in the metal salt-containing composition. For example, the water may be contained in the organic solvent, or the water may be contained as a hydrate of the metal salt. It is preferred that the water content of the composition is higher than or equal to 0.05% by weight based on the whole weight of the metal salt-containing composition.

The manufacturing method of the present invention comprising the steps of:
(i) forming the gate electrode on a substrate;
(ii) forming the gate insulating layer on the substrate such that the gate electrode is covered with the gate insulating layer;
(iii) supplying the metal salt-containing composition on the gate insulating layer to form a channel precursor layer, and then subjecting the channel precursor layer to a heat treatment to form the channel layer therefrom; and
(iv) forming the source electrode and the drain electrode such that they are in contact with the channel layer.

In another preferred embodiment, the manufacturing method of the present invention comprising the steps of:
(i)' providing a metal foil;
(ii)' forming the gate insulating layer on the metal foil;
(iii)' supplying the metal salt-containing composition on the gate insulating layer to form a channel precursor layer, and then subjecting the channel precursor layer to a heat treatment to form the channel layer therefrom;
(iv)' forming the source electrode and the drain electrode such that they are in contact with the channel layer;
(v)' forming a sealing layer such that the channel layer, the source electrode and the drain electrode are covered with the sealing layer; and
(vi)' subjecting the metal foil to an etching treatment to form the gate electrode therefrom.

In the manufacturing method of the present invention, the metal salt-containing composition can also be used for the formation of the gate insulating layer. In this case, it is preferred that such metal salt for formation of the gate insulating layer, which is contained in the metal salt-containing composition, is a salt of one or more metals selected from the group consisting of Ba, Y, Zr, Hf, Ta, Al and Si.

In yet another preferred embodiment, the metal salt-containing composition can also be used for the formation of the source electrode and/or the drain electrode. In this case, it is preferred that the metal salt for formation of the source electrode and/or the drain electrode, which is contained in the metal salt-containing composition, is a salt of an electrically-conductive metal.

The present invention also provides a field-effect transistor which can be obtained by the above manufacturing method. The field-effect transistor of the present invention comprises:
a channel layer;
a gate electrode;
a gate insulating layer positioned at least between the channel layer and the gate electrode; and
source and drain electrodes located in contact with the channel layer,
wherein the channel layer comprises a metal oxide formed from the metal salt-containing composition.

The field-effect transistor of the present invention is characterized in that the channel layer is made from a metal oxide derived from the "metal salt-containing composition comprising a metal salt, a polyvalent carboxylic acid having a cis-form structure of —C(COOH)=C(COOH)— with a molar ratio of the polyvalent carboxylic acid to the metal salt being 0.5 to 4.0, an organic solvent and a water". The field-effect transistor of the present invention may be a thin film transistor.

The term "gate insulating layer positioned at least between the channel layer and the gate electrode" used in the present description substantially means that at least a part of the gate insulating layer is located between the channel layer and the gate electrode (see FIG. 1).

In one preferred embodiment, a surface of the channel layer has an arithmetic mean roughness (Ra) of not more than 10 nm, preferably not more than 0.5 nm, and more preferably not more than 0.15 nm. In other words, the arithmetic mean roughness (Ra) regarding the surface (especially "upper surface" in the drawings) of the channel layer is in the range of 0 (excluding 0) to 10 nm, and preferably in the range of 0 (excluding 0) to 0.5 nm, the more preferably in the range of 0 (excluding 0) to 0.15 nm. Accordingly, the channel layer has a substantially flat surface. The phrase "arithmetic mean roughness Ra" as used in this description and claims substantially means a mean value calculated from the sum of absolute values of the deviations from the average line over the length L of an evaluation section that is set in the roughness curve ("roughness curve" in this case corresponds to a section profile of the surface of the channel layer). See FIG. 26.

In one preferred embodiment, the metal oxide of the channel layer is an amorphous oxide. Depending on the metal salt of the composition, the metal oxide of the channel layer may comprise Zn. In a case where the metal oxide comprises Zn, it is preferred that the metal oxide further comprises one or more metals selected from the group consisting of In and Ga. In this case, the metal oxide has a density of 4.0 to 5.5 g/cm$^3$, and thus it is in a form of a densified film.

In yet another preferred embodiment, the gate insulating layer comprises the metal oxide formed from the metal salt-containing composition for formation of the gate insulating layer. That is, the gate insulating layer is made of the metal oxide derived from "metal salt-containing composition comprising a metal salt, a polyvalent carboxylic acid having a cis-form structure of —C(COOH)=C(COOH)— with a molar ratio of the polyvalent carboxylic acid to the metal salt being 0.5 to 4.0, an organic solvent and a water". It is preferred in this case that the metal oxide of the gate insulating layer is an oxide of one or more metals selected from the group consisting of Ba, Y, Zr, Hf, Ta and Al.

In yet another preferred embodiment, the source electrode and/or the drain electrode comprise(s) an electrically-conductive metal oxide formed from the metal salt-containing composition for formation of the source electrode and/or drain electrode formation. The source electrode and/or the drain electrode is/are made of the electrically-conductive metal oxide derived from "metal salt-containing composition comprising a metal salt, a polyvalent carboxylic acid having a cis-form structure of —C(COOH)=C(COOH)— with a molar ratio of the polyvalent carboxylic acid to the metal salt is in the range of 0.5 to 4.0, an organic solvent and a water".

Effect of the Invention

In accordance with the present invention (i.e., manufacturing method of a field-effect transistor), a channel layer having a form of a thin film can be obtained by applying or printing the raw material therefor, followed by a heat-treatment thereof. Therefore, a field-effect transistor can be produced by a simpler process. In particular, a transistor with its larger area can be produced by a simpler process. This means that an improved productivity of the field-effect transistor can be suitably achieved, which leads to a cost reduction.

Particularly, the present invention can produce a substantially dense channel layer having uniformity and flatness, which is attributed to the metal salt-containing composition used for the formation thereof. This leads to an advantageous effect in that a difference among a plurality of transistors disposed over a large area is reduced, resulting in a TFT exhibiting a stable and high performance.

Similarly, the use of the metal salt-containing composition can produce a substantially dense gate insulating layer having uniformity and flatness. This leads to an advantageous effect in that a field-effect transistor can be suitably manufactured wherein an element having a high mobility and operating voltage as well as a reliability can be provided over a large area.

Furthermore, the use of the metal salt-containing composition can produce a substantially dense source electrode and/or drain electrode having uniformity and flatness. This leads to an advantageous effect in that a contact resistance of the electrode can be lowered in the field-effect transistor, and thereby an element with its high mobility can be provided over a large area.

Figure 1:
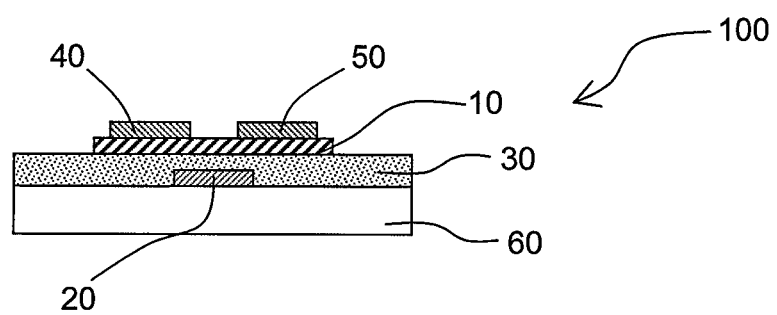
FIG. 1 illustrates a cross-sectional view of the structure of a thin film transistor according to First Embodiment of the present invention.

Reference numerals used throughout the drawings mean the following elements:
- 10: Channel layer
- 11: Channel precursor layer
- 12: Metal oxide film
- 20: Gate electrode
- 30: Gate insulating layer (gate insulating film)
- 31: Gate insulating precursor layer
- 40: Source electrode
- 41, 51: Precursor layers of source and drain electrodes
- 50: Drain electrode
- 60: Substrate
- 70: Sealing layer
- 80a, 80b: Extraction electrodes
- 90: Metal foil
- 100: Field-effect transistor (for example, thin film transistor)
- 1000: Image display device
- 1100: TFT unit
- 1200, 1300: Driver unit
- 1400: EL unit

DETAILED DESCRIPTION OF THE INVENTION

Hereinafter, the manufacturing method of a field-effect transistor of the present invention will be described with reference to the accompanied drawings. The explanation of the field-effect transistor will be included in such description on the manufacturing method thereof.

<<Metal Salt-Containing Composition>>

The manufacturing method of the present invention is concerned with a method for producing a field-effect transistor 100 comprising a gate electrode 20, a source electrode 40, a drain electrode 50, a channel layer 10 and a gate insulating layer 30 (see FIG. 1). The manufacturing method of the present invention is characterized at least in that "metal salt-containing composition comprising a metal salt, a polyvalent carboxylic acid having a cis-form structure of —C(COOH)=C(COOH)— (wherein a molar ratio of the polyvalent carboxylic acid to the metal salt is in the range of 0.5 to 4.0), an organic solvent and a water" is used for the formation of a channel layer of the field-effect transistor.

In the manufacturing method of the present invention, the above metal salt-containing composition can be used not only for the formation of the channel layer, but also for the formation of the gate insulating layer, the source electrode and drain electrode of the field-effect transistor. In other words, the manufacturing method of the present invention makes use of the "metal salt-containing composition comprising a metal salt, a polyvalent carboxylic acid having a cis-form structure of —C(COOH)=C(COOH)— (wherein a molar ratio of the polyvalent carboxylic acid to the metal salt is in the range of 0.5 to 4.0), an organic solvent and a water" so as to form layer(s) or film(s) of the field-effect transistor. In the following description, the metal salt-containing composition for the formation of the channel layer will be mainly explained, which is however applicable to the metal salt-containing compositions for the formation of the gate insulating layer as well as for the formation of the source and drain electrodes.

It has been found by the inventors of the present invention that a moiety of cis-form structure is essential one since the uniformity and flatness of the metal oxide thin film is caused to be lowered in case of the use of the polyvalent carboxylic acid having no cis-form structure. Too small amount of the polyvalent carboxylic acid with respect to that of the metal salt can cause the uniformity of the metal oxide film to be lowered. Too large amount of the polyvalent carboxylic acid with respect to that of the metal salt can also cause the uniformity of the metal oxide film to be lowered due to the presence of the excessive organic components in the film during the sintering process thereof. Therefore, a molar ratio of the polyvalent carboxylic acid to the metal salt is preferably in the range of 0.5 to 4.0, more preferably in the range of 0.8 to 2.0.

As long as the polyvalent carboxylic acid has the moiety of cis-form structure, any carboxylic acid may be used. For example, the polyvalent carboxylic acid of the composition may be at least one carboxylic acid selected from the group consisting of maleic acid, citraconic acid, phthalic acid and trimellitic acid. From the viewpoint of a lowered decomposition temperature and a capability of forming a denser film having more uniformity and flatness, the maleic acid is preferably used as the polyvalent carboxylic acid. Alternatively, the C=C bond of the polyvalent carboxylic acid may be a carbon-carbon double bond which constitutes an aromatic compound.

The polyvalent carboxylic acid may be used in any forms. For example, an anhydride of the polyvalent carboxylic acid as described above may be used in combination with a water-containing solvent to generate a polyvalent carboxylic acid in the solvent.

The kind of the metal salt which is contained in the metal salt-containing composition may be appropriately selected depending on the layer (or film) to be formed. For example, it is preferred that the metal salt used for the formation of the channel layer is a salt of at least one metal selected from the group consisting of Mg (magnesium), Ca (calcium), Sr (strontium), Ba (barium), Y (yttrium), Ti (titanium), Zr (zirconium), Hf (hafnium), Nb (niobium), Ta (tantalum), Cr (chrome), W (tungsten), Fe (iron), Ni (nickel), Cu (copper), Ag (silver), Zn (zinc), Al (aluminum), Ga (gallium), In (indium), Sn (tin) and Sb (antimony). This is because oxides of these metal salts are capable of forming a semiconductor in a form of oxide made of single kind of metal or plural kinds of metals.

Particularly as for the formation of the channel layer, it is preferred that the metal salt contained in the metal salt-containing composition is a salt comprising at least Zn (zinc). In this case, the metal salt-containing composition preferably comprises a salt of at least one metal selected from the group consisting of In (indium) and Ga (gallium). This is because the oxides of these metal salts are suitable for the field-effect transistor (for example, the thin film transistor) in terms of its mobility and stability.

A salt form of the metal salt is not particularly limited. It may be at least one selected from the group consisting of nitrate, sulfate, carboxylate, halide, alkoxide and acetylacetonate.

As long as the metal salt is capable of dissolving into the solvent, the content (i.e., concentration) of the metal salt in the metal salt-containing composition is not particularly limited, and thus can be appropriately adjusted depending on the thickness of the metal oxide film (i.e., channel layer, gate insulating layer and/or source and drain electrodes). For example, the content (i.e., concentration) of the metal salt in the metal salt-containing composition may be in the range of about 0.005 mol/L to about 1 mol/L (based on the whole composition under a room temperature).

Particularly as for the formation of the channel layer, the metal salt-containing composition comprising a salt of Zn, a salt of In and a salt of Ga may be used wherein they are contained respectively in equimolar amounts. For example, each of the above salts may be contained in the concentration of about 0.01 mol/L to about 0.5 mol/L, more preferably of about 0.05 mol/L to about 0.15 mol/L (for example, about 0.1 mol/L) based on the whole composition under a room temperature.

As for the formation of the gate insulating layer, it is preferred that the metal salt contained in the metal salt-containing composition is a salt of at least one metal selected from the group consisting of Ba (barium), Y (yttrium), Zr (zirconium), Hf (hafnium), Ta (tantalum) and Al (aluminum). Just as an example, in a case where the composition with a salt of any of the above metals therein is used, the concentration of the metal salt may be in the range of about 0.05 mol/L to about 1 mol/L, preferably in the range of about 0.2 mol/L to about 0.8 mol/L, based on the whole composition under a room temperature.

As for the formation of the source electrode/drain electrode, it is preferred that the metal salt contained in the metal salt-containing composition is a salt of an electrically-conductive metal. For example, the metal salt is preferably a salt of at least one metal selected from the group consisting of Zn (zinc), Al (aluminum), In (indium), Sn (tin), Mo (molybdenum), Ir (iridium) and Ru (ruthenium). In a case where the composition with a salt of any of the above metals therein is used, the concentration of the metal salt may be in the range of about 0.05 mol/L to about 1 mol/L, preferably in the range of about 0.2 mol/L to about 0.8 mol/L, based on the whole composition under a room temperature.

The organic solvent contained in the metal salt-containing composition is not particularly limited as long as it is capable of stably dissolving the metal salt and the polyvalent carboxylic acid. For example, the organic solvent may be at least one selected from the group consisting of methanol, ethanol, ethylene glycol, propylene glycol, 1,3-propanediol, 1,3-butanediol, 3-methoxy methyl butanol (for example, 3-methoxy-3-methyl-1-butanol), N-methylpyrrolidone and terpineol. The content of the organic solvent is, but not particularly limited to, in the range of about 60% to 90% by weight, preferably in the range of about 68% to 85% by weight, based on the whole composition.

The metal salt-containing composition contains water. It is preferred that the solution which contains the metal salt, the polyvalent carboxylic acid and the organic solvent has the water content of higher than or equal to about 0.05% by weight. The water content of the composition is more preferably in the range of 1% by weight to 50% by weight, most preferably in the range of 5% by weight to 20% by weight, based on the whole composition.

The form of the water contained in the metal salt-containing composition is not particularly limited, and thus the water may have any suitable form. For example, the water may be derived from a hydrate of the metal salt contained in the composition. Alternatively, the water may be derived from the organic solvent which contains the water. In any form, it is preferred that the water content is higher than or equal to about 0.05% by weight based on the whole composition.

Process of Manufacturing Method

First Embodiment

With reference to FIGS. 2(a) to 2(e), the process steps for manufacturing a thin film transistor (TFT) 100 illustrated in FIG. 1 will be described.

Figure 2:
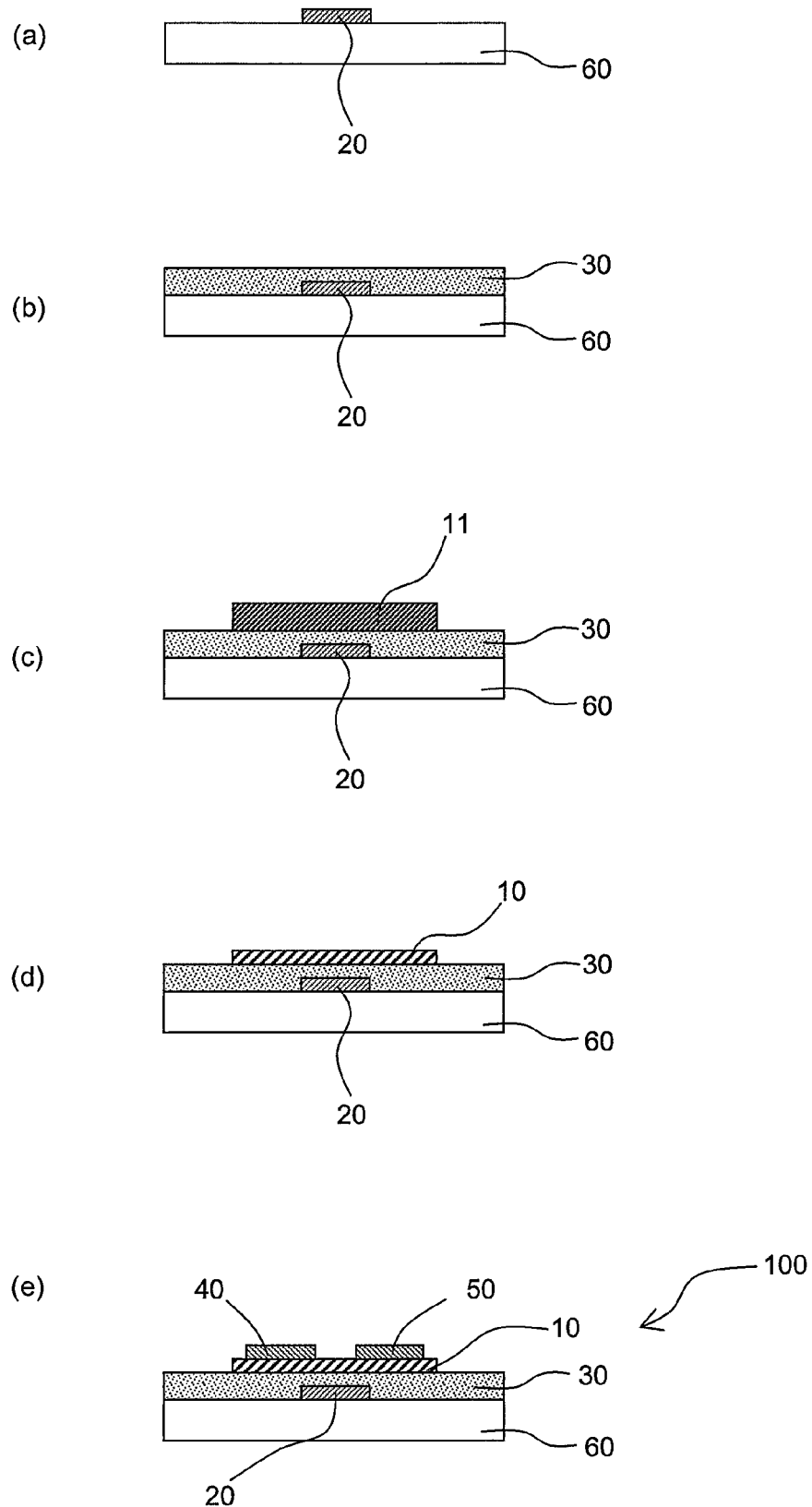
FIG. 2 illustrates cross-sectional views showing the steps in a manufacturing process of a thin film transistor according to First Embodiment of the present invention.

Upon carrying out the manufacturing method of the thin film transistor 100 according to the present invention, the step (i) is firstly performed. That is, as shown in FIG. 2(a), a gate electrode 20 is formed on a substrate 60.

As the materials of the substrate 60, a glass, an alumina, a glass-alumina composite, a silicon, an epoxy resin, a polyimide resin or a stainless steel can be used. The glass substrate is used as the substrate 60 in this embodiment. The thickness of the substrate 60 is preferably in the range of about 50 μm to about 1800 μm, more preferably in the range of about 200 μm to about 800 μm (for example, about 700 μm).

The gate electrode 20 is formed in place on the substrate. As the material of the gate electrode 20, a metal material such as gold (Au), silver (Ag), copper (Cu), nickel (Ni), chrome (Cr), cobalt (Co), magnesium (Mg), calcium (Ca), platinum (Pt), molybdenum (Mo), iron (Fe) and/or zinc (Zn); or an electrically-conductive oxide such as tin oxide ($SnO_2$), indium tin oxide (ITO), fluorine-containing tin oxide (PTO), ruthenium oxide ($RuO_2$), iridium oxide ($IrO_2$) and platinum oxide ($PtO_2$) may be used. The formation method of the gate electrode is not particularly limited, and thus a conventional method for an electrode formation can be adopted. For example, a printing method/printing process can be used for the formation of the gate electrode. Alternatively, a vacuum deposition method or a sputtering method can also be used for the formation of the gate electrode. In this embodiment, an ITO layer is provided as the gate electrode by the sputtering method using a mask. The thickness of the gate electrode 20 is preferably in the range of about 10 nm to about 100 nm, more preferably in the range of about 15 nm to about 50 nm (for example, about 30 nm).

Subsequent to the step (i), the step (ii) is performed. That is, as shown in FIG. 2(b), a gate insulating layer 30 is formed on the substrate 60, and thereby the gate electrode 20 is covered with the gate insulating layer 30.

The gate insulating layer 30 can be an insulating film made of a resin-based material or an inorganic insulating-based material. Examples of the insulating film made of the resin-based material may include a film made of an epoxy resin, a polyimide (PI) resin, a polyphenylene ether (PPE) resin, a polyphenylene oxide resin (PPO), a polyvinylpyrrolidone (PVP) resin and the like, for example. While on the other hand, examples of the insulating film made of the inorganic insulating-based material may include a film made of metal oxides such as a tantalum oxide (e.g., $Ta_2O_5$), an aluminum oxide (e.g., $Al_2O_2$), an silicon oxide (e.g., $SiO_2$), a zeolite oxide (e.g., $ZrO_2$), a titanium oxide (e.g., $TiO_2$), a yttrium oxide (e.g., $Y_2O_3$), a lanthanum oxide (e.g., $La_2O_2$), a hafnium oxide (e.g., $HfO_2$) and a film made of nitrides of the above metals, for example. The gate insulating layer may also be a film made of a dielectric material such as a barium titanate ($BaTiO_3$), a strontium titanate ($SrTiO_3$), a calcium titanate ($CaTiO_2$).

A printing method/printing process can be used for the formation of the gate insulating layer 30. Alternatively, a vacuum deposition method or a sputtering method can also be used for the formation of the gate insulating layer 30. Particularly as for the gate insulating film 30 made of the resin-based material, it can be formed by applying a coating agent consisting of the mixture of a resin material and a medium (in which case the coating agent may be a resist material which contains a photosensitizing agent) to a predetermined position, followed by drying and heat treatments thereof to cure the applied coating agent. While on the other hand, as for the gate insulating film 30 made of the inorganic insulating-based material, it can be formed by the thin film formation method (for example, sputtering method) using a mask. In this embodiment, a tantalum oxide film ($Ta_2O_5$) is formed as the gate insulating layer 30 by the sputtering method. The thickness of the gate insulating layer 30 is preferably in the range of about 0.1 μm to about 2 μm, more preferably in the range of about 0.2 μm to about 1 μm (for example, about 0.3 μm).

Subsequent to the step (ii), the step (iii) is performed. That is, as shown in FIG. 2(c), a metal salt-containing composition is applied on the gate insulating layer 30 to form a channel precursor layer 11. The resulting channel precursor layer 11 is then subjected to a heat treatment to form a channel layer 10 therefrom (see FIG. 2(d)).

The method for applying the metal salt-containing composition is not particularly limited. For example, any suitable process such as a spray coating process, spin coating process, a screen-printing process, a gravure coating process, a bar coating process, a roll coating process, a die coating process or an ink-jet printing process may be used for the application of the metal salt-containing composition. These application processes may be appropriately selected depending on a viscosity of the metal salt-containing composition, and thereby the channel precursor layer having a uniform thickness (that is, uniform layer thickness of the precursor) can be formed. The thickness of the channel precursor layer 11 is preferably in the range of about 30 μm to about 300 μm, more preferably in the range of about 50 μm to about 150 μm (for example, about 70 μm).

The heat treatment of the channel precursor layer 11 causes the channel precursor layer to be sintered, and thereby a channel layer 10 was formed therefrom. It is preferred that the heat treatment of the channel precursor layer is performed as two-step treatment composed of a first heating step (i.e., primary heating step) and a second heating step (i.e., secondary heating step). Specifically, it is preferred that the channel precursor layer 11 is subjected to a drying treatment under a temperature condition of 100° C. to 250° C. for about 1 minute to about 15 minutes as the first heating step, and then the channel precursor 11 is subjected to a substantial sintering treatment at a temperature of 400° C. to 600° C. (more preferably 400° C. to 500° C.) for about 10 minutes to about 60 minutes as the second heating step. A reason for this is that, when the heat treatment is performed at 400° C. or higher without undergoing the first heating step, the resulting metal oxide film (i.e., "channel layer") tends to have non-uniform and a mottled portion is likely to occur in the metal oxide film. Such "non-uniform" can cause the thin film transistor to be unstable, which leads to a detriment of a practical value of the transistor.

The temperature of the first heating step may be appropriately selected depending on the kind of the organic solvent contained in the metal salt-containing composition. In light of the fact that the metal salt-containing composition contains the water, it is preferred that the temperature of the first heating step is 100° C. or higher, and thereby the lower limit of the first heating step is 100° C. While on the other hand, when the temperature of the first heating step is too high, an intermediate of oxide film formed after the first heating step tends to hardly become uniform. Thus, the upper limit temperature of the first heating step is preferably 250° C.

The temperature of the second heating step can promote the substantial formation of the metal oxide film. In this regard, when the temperature of the second heating step is too low, the amount of the residues in the metal oxide film increases, which can cause the semiconductor performance of the channel layer to be lowered. From this standpoint, the temperature of the second heating step is preferably not less than 400° C. That is, it is preferred that the lower limit temperature of the second heating step is 400° C. The upper limit temperature of the second heating step may be appropriately determined depending on the heat-resistant temperature of the substrate 60 and the properties of the metal oxide film. For example in a case where a glass substrate is used as the substrate, the upper limit temperature of the second heating step may be about 500° C. Even when a substrate having a high heat-resistance is used, the metal oxide film (for example, an In—Ga—Zn-based amorphous metal oxide film) tends to crystallize at a temperature of more than 600° C., which can reduce the reliability. From this standpoint, the upper limit temperature of the second heating step is preferably 600° C.

The pressure condition of the heat treatment in the step (iii) is not particularly limited. For example, the pressure condition may be an atmospheric pressure.

As a heating means, a heating furnace may be used, for example. The overall heating of the channel precursor layer can be performed by putting "substrate 60 equipped with the gate electrode 20, the gate insulating layer 30 and the channel precursor layer 11" into the heating furnace.

The channel layer 10, which is obtained by the heat treatment in the step (iii), may have the thickness preferably in the range of about 8 nm to about 50 nm, more preferably in the range of about 10 nm to about 30 nm (for example, about 15 nm).

As the heat treatment of the channel precursor layer in the step (iii), processes other than the above-mentioned sintering are possible. It is possible to perform a sintering with a laser irradiation, for example.

Subsequent to the step (iii), the step (iv) is performed. That is, as shown in FIG. 2(e), the source electrode 40 and the drain electrode 50 are formed such that they are in contact with the channel layer 10. As the material of the source/drain electrodes, a metal having a sufficient electroconductivity is preferably used. For example, copper (Cu), nickel (Ni), aluminum (Al) and stainless steel (SUS) can be used as the metal of the source/drain electrodes. The formation method of the source electrode 40 and the drain electrode 50 is not particularly limited, and thus conventional method of the electrode formation can be adopted. For example, a printing method/printing process can be used for the formation of the source electrode and the drain electrode. Alternatively, a vacuum deposition method or a sputtering method can also be used for the formation of the source electrode and the drain electrode. In this embodiment, an aluminum electrodes are provided as the source/drain electrodes by performing the vacuum deposition method. The thickness of each of the source electrode 40 and the drain electrode 50 is preferably in the range of about 0.02 µm to about 10 µm, more preferably in the range of about 0.03 µm to about 1 µm (for example, about 0.1 µm).

Subsequent to the formation of the source/drain electrodes, the sealing of the channel layer and the formation of the wirings may be performed as necessary.

Throughout the above steps (i) to (iv), there can be finally obtained the thin film transistor 100 as shown in FIG. 2(e) or FIG. 1. In accordance with the above production steps, "semiconductor film made of metal oxide" serving as the channel layer 10 can be formed in a uniform, dense and flat state, compared with that of the prior art process using a conventional application method. That is, the present invention can produce a thin film transistor having a high-performance with a low cost wherein the use of an expensive vacuum apparatus for the channel formation is excluded.

As shown in FIG. 1, the thin film transistor 100 thus produced comprises the channel layer 10, the gate electrode 20, the gate insulating layer 30 positioned at least between the channel layer 10 and the gate electrode 20, and the source electrode 40 and the drain electrode 50 located in contact with the channel layer 10. In the thin film transistor 100, the channel layer 10 comprises a metal oxide wherein the metal oxide is an oxide formed from the above-mentioned metal salt-containing composition. Particularly due to the formation from the above-mentioned metal salt-containing composition, the channel layer 10 is in a thin film form wherein it has a substantially uniform and dense film with its surface being flat. It is preferred that the metal oxide of the channel layer 10 is in a form of an amorphous oxide. Furthermore, it is preferred that the channel layer 10 has a carrier mobility of less than $10^{18}$ cm$^{-3}$ (which is favorable in terms that an off-current is not so large).

For example, when the channel layer is formed using the metal salt-containing composition in which the salt comprising at least Zn (zinc) is contained, the resulting channel layer 10 is in a film form made of the metal oxide comprising the Zn. When the channel layer is formed using the metal salt-containing composition in which the salt comprising not only Zn (zinc) but also In (indium) and/or Ga (gallium) is contained, the resulting channel layer 10 is in a film form made of the In and/or Ga in addition to the Zn. In a case where the channel layer particularly has a film form made of the metal oxide comprising Zn, In and Ga, the density of the channel layer 10 may be in the range of about 4.0 g/cm$^3$ to 5.5 g/cm$^3$, for example in the range of about 4.3 g/cm$^3$ to 4.8 g/cm$^3$ (wherein the film thickness thereof is in the range of about 10 nm to 40 nm).

Modified Embodiment of First Embodiment

Then, a modified embodiment of the manufacturing process of the thin film transistor according to First Embodiment will be described with reference to FIGS. 3(a) to 3(e). Note that the same explanations as that of the above-mentioned production process will be omitted.

Figure 3:
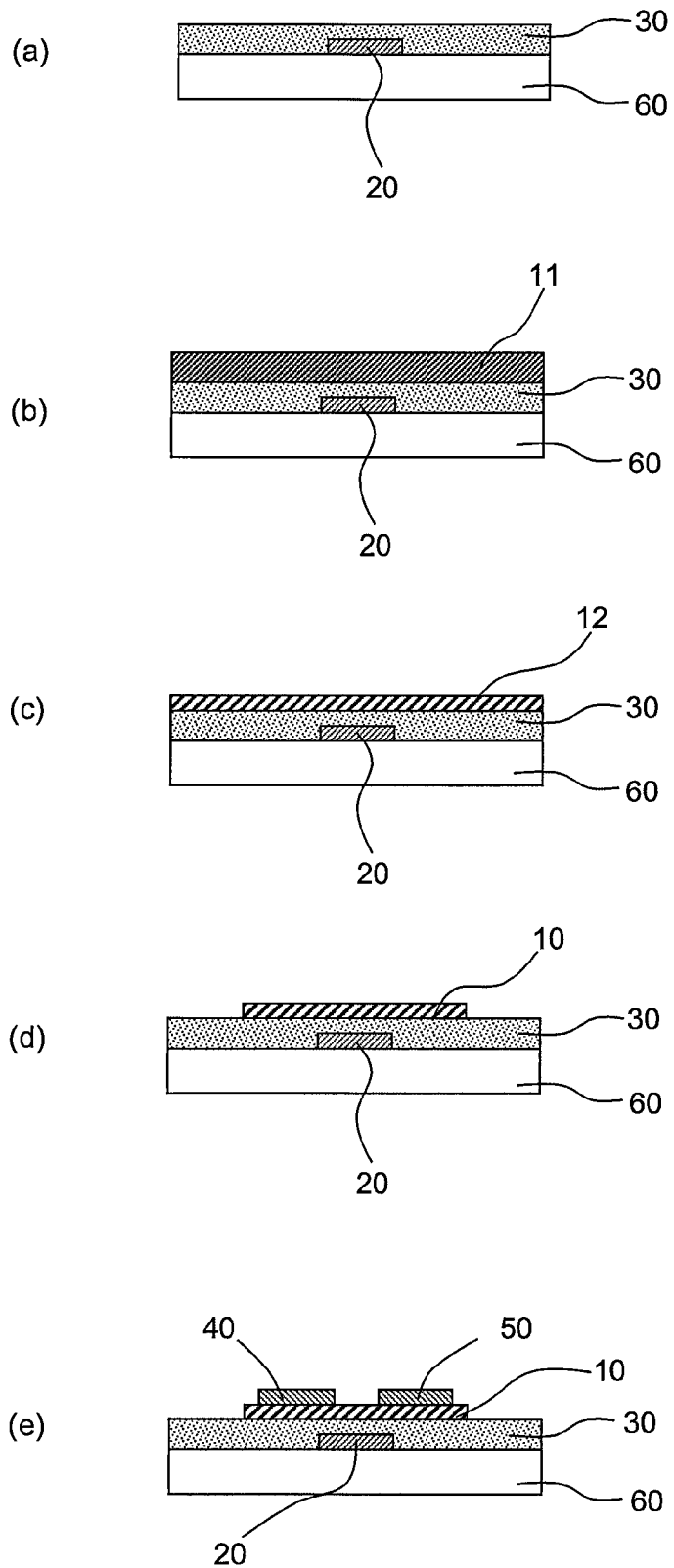
FIG. 3 illustrates cross-sectional views showing the steps in another manufacturing process of a thin film transistor according to First Embodiment of the present invention.

First, as shown in FIG. 3(a), a gate electrode 20 and a gate insulating layer 30 are formed on a substrate 60.

Subsequently, as shown in FIG. 3(b), the metal salt-containing composition is applied onto an almost entire surface of the gate insulating layer 30 to form a channel precursor layer 11. Subsequently, the channel precursor layer 11 is subjected to a heat treatment, and thereby a metal oxide film 12 is formed from the precursor layer 11 (see FIG. 3(c)).

Then, as shown in FIG. 3(d), the metal oxide film 12 is partially removed, and thereby forming a channel layer therefrom at a predetermined position opposed to the gate electrode 20. The partial removal of the metal oxide film can be performed by a dry etching or a wet etching, for example.

Finally, as shown in FIG. 3(e), a source electrode 40 and a drain electrode 50 can be formed in contact with the channel layer 10, which makes it possible to complete the manufacturing of the thin film transistor 100.

Second Embodiment

The process steps for manufacturing the thin film transistor according to Second Embodiment will be described with reference to FIGS. 4(a) to 4(e). In this embodiment, the metal salt-containing composition is used not only for the formation of the channel layer, but also for the formation of the gate insulating layer. The same explanations as that of the above-mentioned production process will be omitted.

Figure 4:
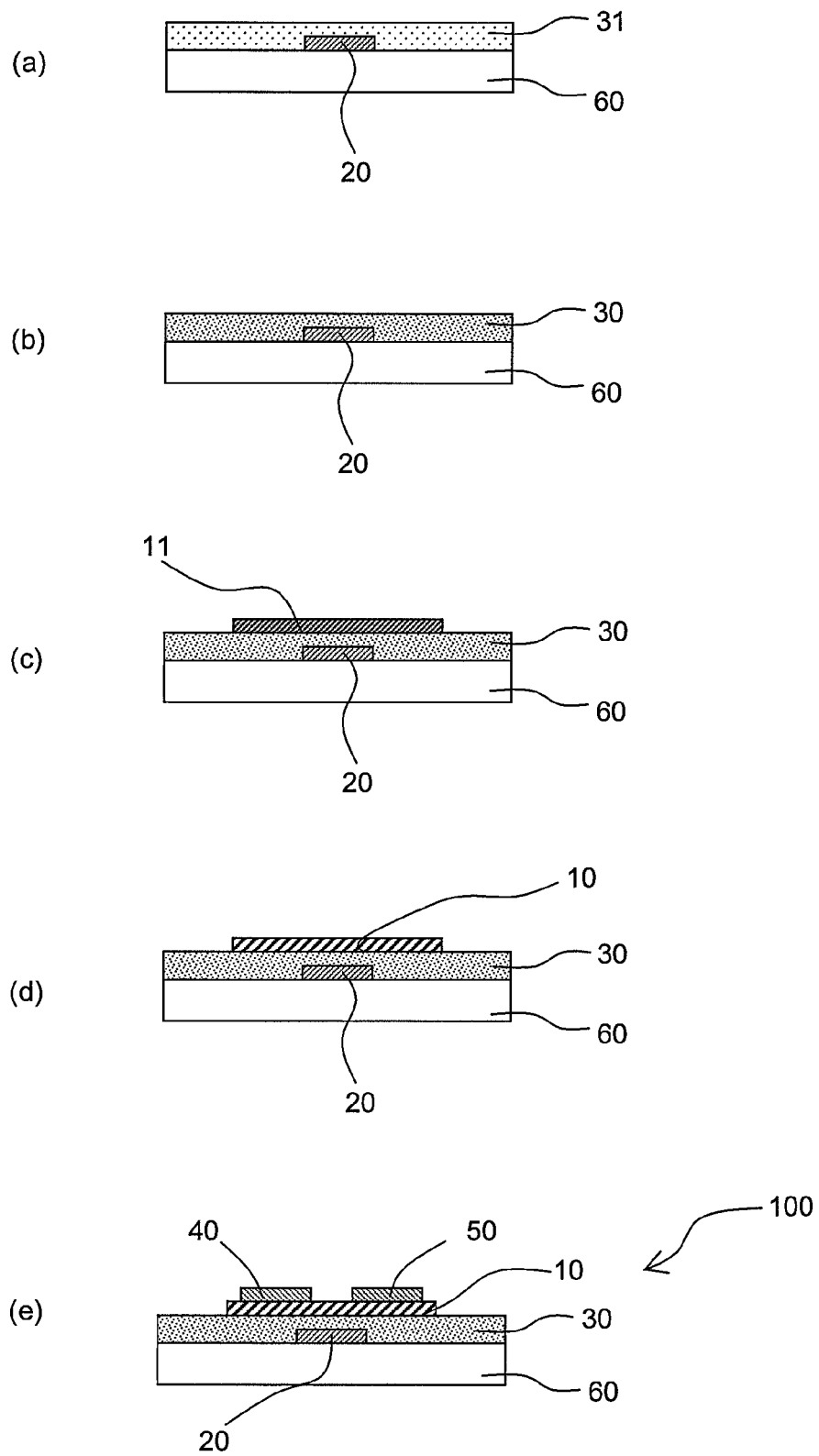
FIG. 4 illustrates cross-sectional views showing the steps in a manufacturing process of a thin film transistor according to Second Embodiment of the present invention.

As shown in FIG. 4(a), a gate electrode 20 is firstly formed on a substrate 60, and thereafter the metal salt-containing composition for formation of gate insulating layer is applied to form a gate insulating precursor layer 31. The metal salt-containing composition for formation of gate insulating layer is the "metal salt-containing composition comprising a metal salt, a polyvalent carboxylic acid having a cis-form structure of —C(COOH)=C(COOH)— with a molar ratio of the polyvalent carboxylic acid to the metal salt being 0.5 to 4.0, an organic solvent and a water". The metal salt contained in the metal salt-containing composition for formation of gate insulating layer is preferably a salt of at least one metal selected from the group consisting of Ba, Y, Zr, Hf, Ta, Al and Si. Since the oxide of such metal has a high insulating property and a dielectric constant, it is favorable for use in the formation of the gate insulating layer. In this embodiment, a metal salt which contains Al therein is used.

Next, the gate insulating precursor layer 31 is subjected to a heat treatment to form a gate insulating layer 30 therefrom (see FIG. 4(b)). Similar to the above-mentioned formation of the channel layer, it is preferable to perform the heat treatment as two-step treatment composed of a first heating step and a second heating step to from the gate insulating layer. Specifically, it is preferred that the gate insulating precursor layer 31 is subjected to a drying treatment under a temperature condition of 100° C. to 250° C. for about 1 minute to about 15 minutes as the first heating step, and then the gate insulating precursor layer 31 is subjected to a substantial sintering treatment at a temperature of 400° C. to 600° C. (more preferably 400° C. to 500° C.) for about 10 minutes to about 60 minutes as the second heating step.

Subsequent to the formation of the gate insulating layer, the metal salt-containing composition is applied on the gate insulating layer 30 to form a channel precursor layer 11, as shown in FIG. 4(c). The resulting channel precursor layer 11 is then subjected to a heat treatment to form a channel layer 10 therefrom (see FIG. 4(d)).

Finally, as shown in FIG. 4(e), a source electrode 40 and a drain electrode 50 are formed in contact with the channel layer 10 (and thereafter a sealing of the channel layer and a formation of wirings may be performed as necessary), which makes it possible to complete the manufacturing of the thin film transistor 100.

In the thin film transistor 100 thus produced according to Second Embodiment, the gate insulating film 30 is made of the oxide film of at least one metal selected from the group consisting of Ba, Y, Zr, Hf, Ta, Al and Si due to the above metal salt of the composition.

In this embodiment, not only the channel layer 10, but also the gate insulating layer 30 can be formed by a simplified method, which makes it possible to produce the thin film transistor having a large area with further lowered cost.

Third Embodiment

The process steps for manufacturing the thin film transistor according to Third Embodiment will be described with reference to FIGS. 5(a) to 5(e). In this embodiment, the metal salt-containing composition is used not only for the formation of the channel layer, but also for the formation of the source/drain electrodes. The same explanations as that of the above-mentioned production process will be omitted.

Figure 5:
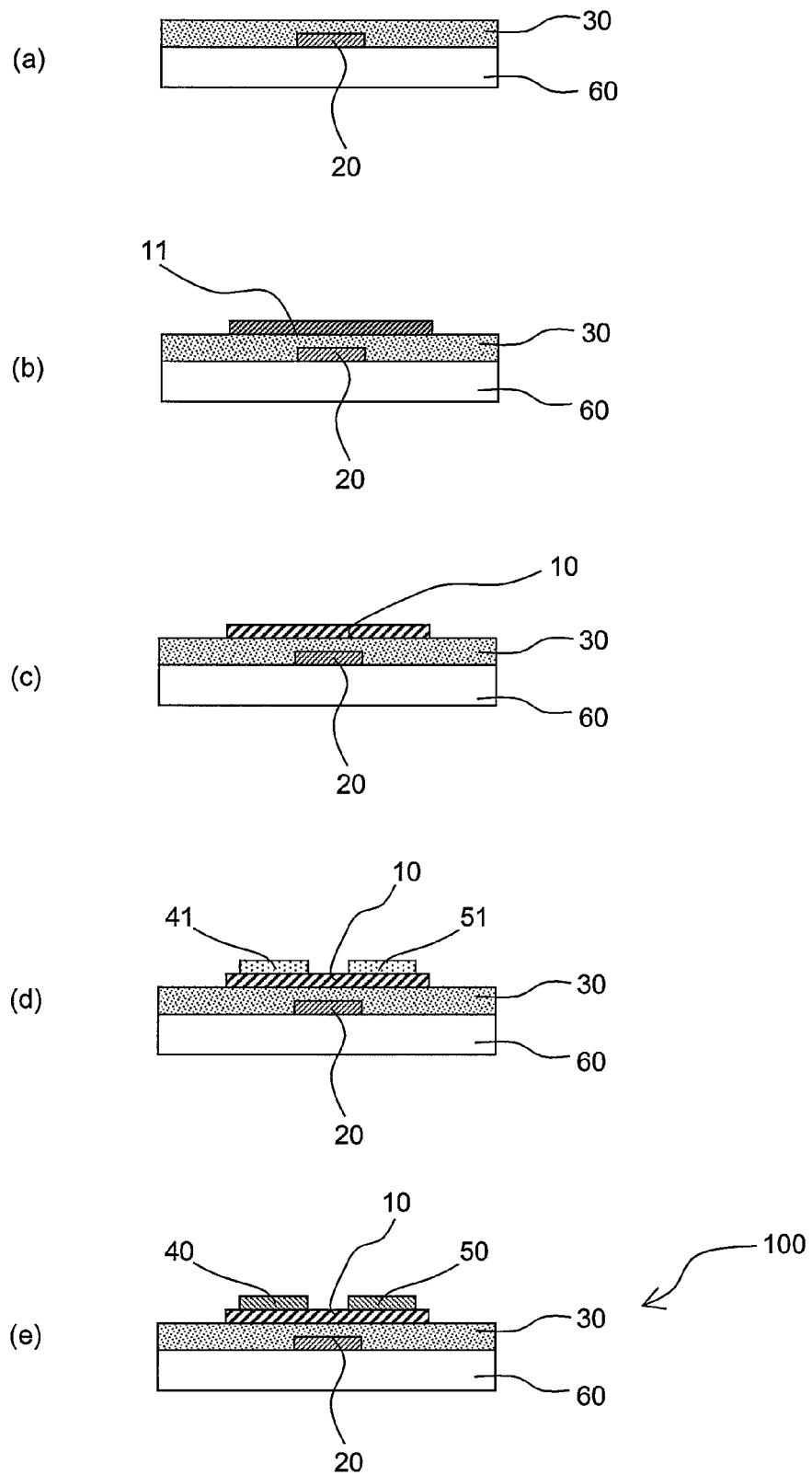
FIG. 5 illustrates cross-sectional views showing the steps in a manufacturing process of a thin film transistor according to Third Embodiment of the present invention.

The embodiments shown in FIGS. 5(a) to 5(c) correspond to those shown in FIGS. 2(a) to 2(d). That is, a gate electrode 20 and a gate insulating layer 30 are formed on a substrate 60 as shown in FIG. 5(a). Thereafter, as shown in FIG. 5(b), the metal salt-containing composition is applied on the gate insulating layer 30 to form a channel precursor layer 11. The resulting channel precursor layer 11 is then subjected to a heat treatment to form a channel layer 10 therefrom, as shown in FIG. 5(c).

Subsequently, the metal salt-containing composition for formation of source/drain electrodes is applied in contact with the channel layer 10 to form precursor layers 41, 51 for the source/drain electrodes (see FIG. 5(d)). The metal salt-containing composition for formation of source/drain electrodes is the "metal salt-containing composition comprising a metal salt, a polyvalent carboxylic acid having a cis-form structure of —C(COOH)=C(COOH)— with a molar ratio of the polyvalent carboxylic acid to the metal salt being 0.5 to 4.0, an organic solvent and a water". The metal salt contained in the metal salt-containing composition for formation of source/drain electrodes is preferably a salt of at least one metal selected from the group consisting of Zn, Al, In, Sn, Mo, Ir and Ru. A reason for this is that the above metal in itself and its oxide compound are capable of forming an electrically-conductive material, which is favorable for use in the formation of the source/drain electrodes. In this embodiment, an In-containing metal salt and a Sn-containing metal salt are used as the material of the source/drain electrodes.

Subsequent to the formation of the precursor layers 41, 51 for the source/drain electrodes, such precursor layers are subjected to a heat treatment to form a source electrode 40 and a drain electrode 50 therefrom (see FIG. 5(e)). The heat treatment of the precursor layers 41, 51 is preferably performed as two-step treatment composed of a first heating step and a second heating step. Specifically, it is preferred that the precursor layers 41, 51 for the source/drain electrodes are subjected to a drying treatment under a temperature condition of 100° C. to 250° C. for about 1 minute to about 15 minutes as the first heating step, and then the precursor layers 41, 51 are subjected to a substantial sintering treatment at a temperature of 400° C. to 600° C. (more preferably 400° C. to 500° C.) for about 10 minutes to 60 minutes as the second heating step.

Subsequent to the formation of the source/drain electrodes, a sealing of the channel layer and a formation of wirings may be performed as necessary. Throughout the above-mentioned steps, there can be finally obtained the thin film transistor 100.

In this thin film transistor 100 thus produced according to Third Embodiment, the source/drain electrodes 40, 50 are made of the oxide film of at least one metal selected from the group consisting of Zn, Al, In, Sn, Mo, Ir and Ru due to the use of the above metal salt of the composition.

In this embodiment, not only the channel layer, but also the source/drain electrodes 40, 50 can be formed by a simple and easy method, which makes it possible to produce the thin film transistor having a large area with further lower cost.

Fourth Embodiment

Figure 6:
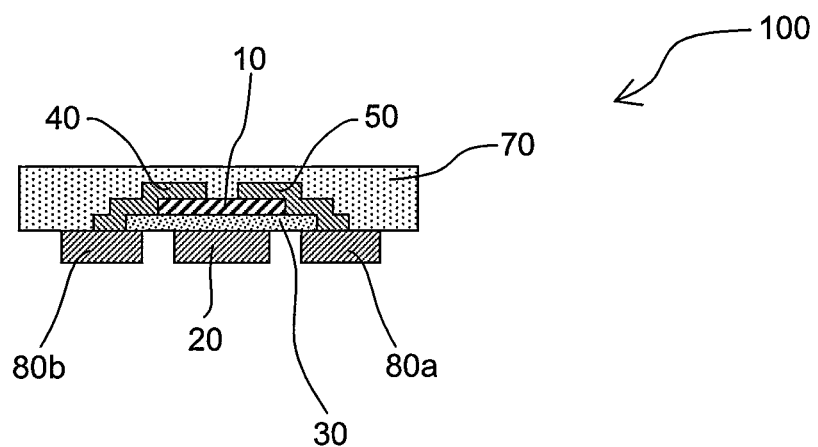
FIG. 6 illustrates cross-sectional views showing the steps in a manufacturing process of a thin film transistor according to Fourth Embodiment of the present invention.

Then, the process steps for manufacturing the thin film transistor (TFT) 100 as shown in FIG. 6 will be described with reference to FIGS. 7(a) to 7(f). The process steps according to Fourth Embodiment correspond to the steps (i)' to (vi)' as described in "SUMMARY OF THE INVENTION". The same explanations as that of the above-mentioned production process will be omitted.

As the step (i)', a metal foil 90 is firstly provided. Subsequently, a gate insulating layer 30 is formed on the metal foil 90 as the step (ii)'. See FIG. 7(a).

The metal foil 90, which can serve as a member for supporting the gate insulating layer 30 and a channel layer 10, is finally used as the material of the electrode. Therefore, as the metal of the metal foil 90, a metal having an electrically-conductive property and a relatively high melting point is preferable. For example, as the metal of the metal foil 90, copper (Cu, melting point: 1083° C.), nickel (Ni, melting point: 1453° C.), aluminum (Al, melting point: 660° C.), stainless steel (SUS) can be used.

The gate insulating layer 30 can be formed by a similar way to that of First or Second Embodiment. That is, the gate insulating layer 30 may be formed by a thin film formation method using a mask (e.g., sputtering method). Alternatively, the gate insulating layer 30 may be formed by applying the metal salt-containing composition for formation of gate insulating layer, followed by the heat treatment thereof.

Subsequent to the step (ii)', the step (iii)' is performed. That is, as shown in FIG. 7(b), the metal salt-containing composition is applied on the gate insulating layer 30 to form a channel precursor layer 11. The resulting channel precursor layer 11 is then subjected to a heat treatment to form a channel layer 10 therefrom (see FIG. 7(c)). More specifically, the channel layer 10 is formed by applying the "metal salt-containing composition comprising a metal salt, a polyvalent carboxylic acid having a cis-form structure of —C(COOH)=C(COOH)— with a molar ratio of the polyvalent carboxylic acid to the metal salt being 0.5 to 4.0, an organic solvent and a water", followed by the heat treatment thereof.

Subsequent to the formation of the channel layer, the step (iv)' is performed. That is, as shown in FIG. 7(d), a source electrode 40 and a drain electrode 50 are formed such that both ends of each electrode make contact with the channel layer 10 and the metal foil 90. The formation method of the source electrode 40 and the drain electrode 50 may be performed by a similar way to that of First or Third Embodiment. That is, the source/drain electrodes can be formed by a vacuum deposition method or a sputtering method and alternatively by applying the metal salt-containing composition for formation of source/drain electrodes, followed by the heating thereof.

Subsequently, the step (v)' is performed. That is, a sealing layer 70 is formed such that it covers the channel layer 10, the source electrode 40 and the drain electrode (see FIG. 7(e)). As the material of the sealing layer 70, resin materials having flexibility after being cured are preferable. Examples of such resin materials include an epoxy resin, a polyimide (PI) resin, an acrylic resin, a poly ethylene terephthalate (PET) resin, a polyethylene naphthalate (PEN) resin, a polyphenylene sulfide (PPS) resin, a polyphenylene ether (PPE) resin, the compound of these resins and the like. Such resin materials are favorable in terms of flexibility and dimensional stability. Thus, the sealing layer made of such materials preferably can provide the field-effect transistor with the flexibility.

The formation method of the sealing layer 70 may be, but not particularly limited to, as follows:
- The method of applying an uncured resin in a liquid state by a spin coating;
- The method of laminating an uncured resin having a form of film onto an upper surface of the metal foil 90; and
- The method of applying an adhesive material on the surface of a sealing layer film 70, followed by laminating the film onto an upper surface of the metal foil 90 via the adhesive material.

In the above laminating, a pressurizing process while performing a heating treatment by means of a roll laminating, a vacuum laminating or a heat press can be appropriately adopted.

Finally, the step (vi)' is performed. That is, as shown in FIG. 7(f), the metal foil 90, which has served as the supporter, is partially etched away to form a gate electrode 20 and extraction electrodes 80a, 80b therefrom. The etching of the metal foil 90 is not particularly limited, and thus can be performed by a conventional process (for example, an etching process using a photolithography technique).

Figure 7:
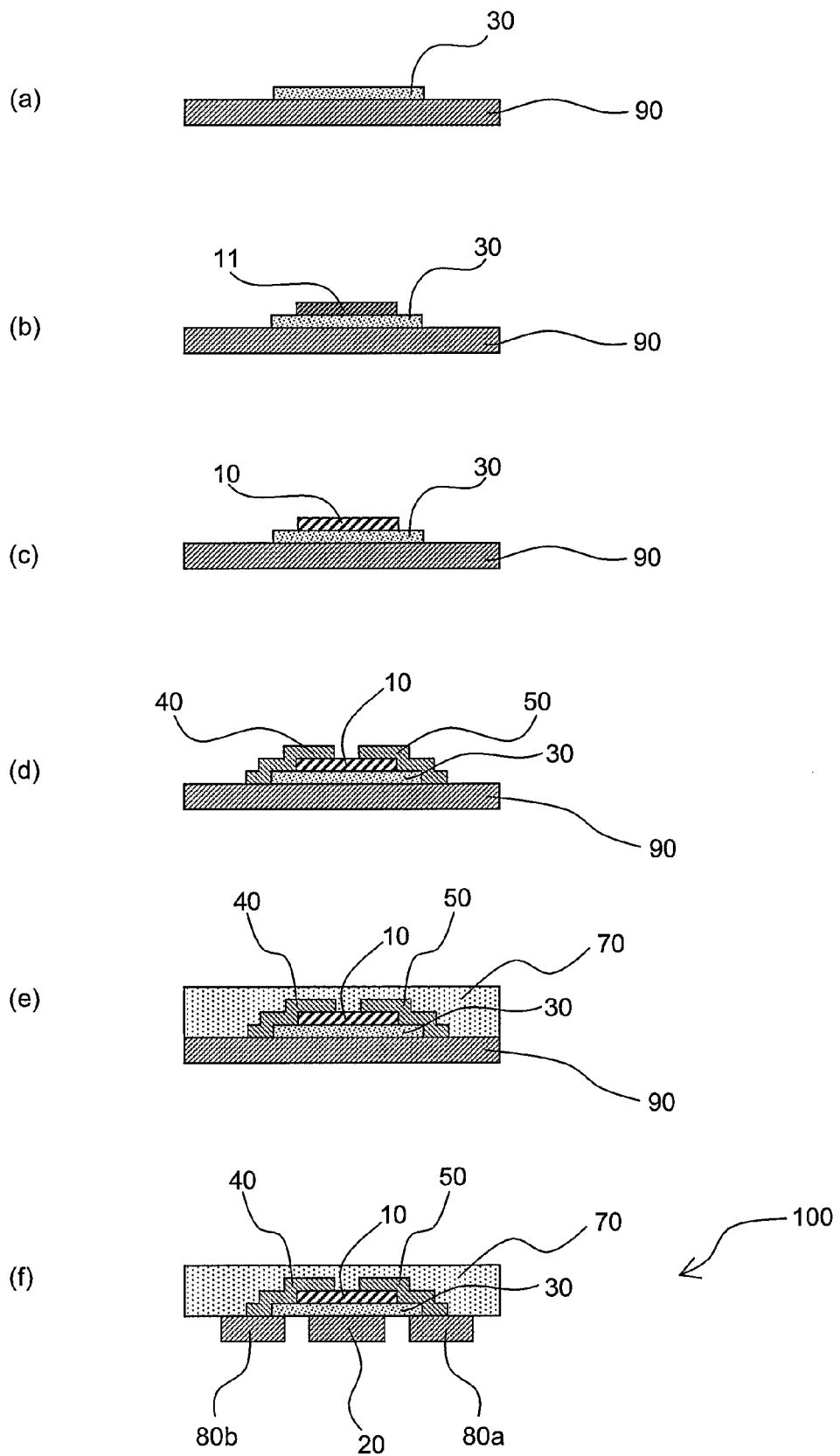
FIG. 7 illustrates cross-sectional views showing the steps in a manufacturing process of a thin film transistor according to Fourth Embodiment of the present invention.

Throughout the above steps (i)' to (vi)', there can be finally obtained the thin film transistor 100 as shown in FIG. 6 to FIG. 7(f). This production process can also form a "semiconductor film of metal oxide" serving as the channel layer 10 in a uniform, dense and flat form, compared with that of the prior art. Therefore, the present invention can produce a thin film transistor having a high-performance with a low cost wherein an expensive vacuum apparatus is not required for the formation of the channel layer. In the manufacturing method according to this embodiment, the sealing layer 70 made of the flexible resin (sealing resin) can serve as a supporting member of the transistor 100, which leads to a simplified production of a flexible thin film transistor. Moreover in the manufacturing method according to this embodiment, the forming of the sealing layer 70 on the metal foil 90 is performed at a point in time after the gate insulating film 30, the channel layer 10, the source electrode 40 and the drain electrode 50 are all formed on the upper surface of the metal foil 90 while making use of the foil 90 as a support. This makes it possible to form all of the channel layer 10, the gate insulating film 30, the source electrode 40 and the drain electrode 50 by a sintering process at a higher temperature than a heat-resistant temperature of the sealing resin.

The thin film transistor 100 thus produced according to Fourth Embodiment comprises the gate electrode 20, the channel layer 10, the gate insulating layer 30, the source electrode 40, the drain electrode 50, the sealing layer 70 and the extraction electrodes 80a, 80b as shown in FIG. 6. Specifically, the thin film transistor 100 is configured to have the gate electrode 20 and the extraction electrodes 80a, 80b, all of them being formed by partially etching away the metal foil, the channel layer 10, the gate insulating film 30 provided therebetween, the source electrode 40 and the drain electrode 50, each of which being in contact with the channel layer 10 and the extraction electrodes 80a, 80b respectively, the sealing layer 70 serving to enclose the channel layer 10, the source electrode 40 and the drain electrode 50. Since the gate electrode 20 and the extraction electrodes 80a, 80b are all formed from the same metal foil, they are located in the same plane as illustrated. One end of each of the source electrode 40 and the drain electrode 50 extends to the outside of the outer edges of the channel layer 10 and the gate insulating layer 30, which electrically interconnects the channel layer 10 and the extraction electrodes 80a, 80b.

A protective layer (not shown), which serves to protect at least the channel layer 10, may be provided on the channel layer 10. This protective layer can prevent the channel layer from being damaged during the sealing process to stabilize a back channel, which leads to an improvement and stability of the transistor performance. As the material of the protective layer, a thermosetting resins (e.g., fluorine resin, polyimide resin), oxides (e.g., $SiO_2$, $Al_2O_3$) or nitrides (e.g., SiN) can be used, for example.

Fifth Embodiment

With reference to FIGS. 9(a) to 9(f), the process steps for manufacturing the thin film transistor (TFT) 100 illustrated in FIG. 8 will be described. The same explanations as that of the above-mentioned production process will be omitted.

Figure 9:
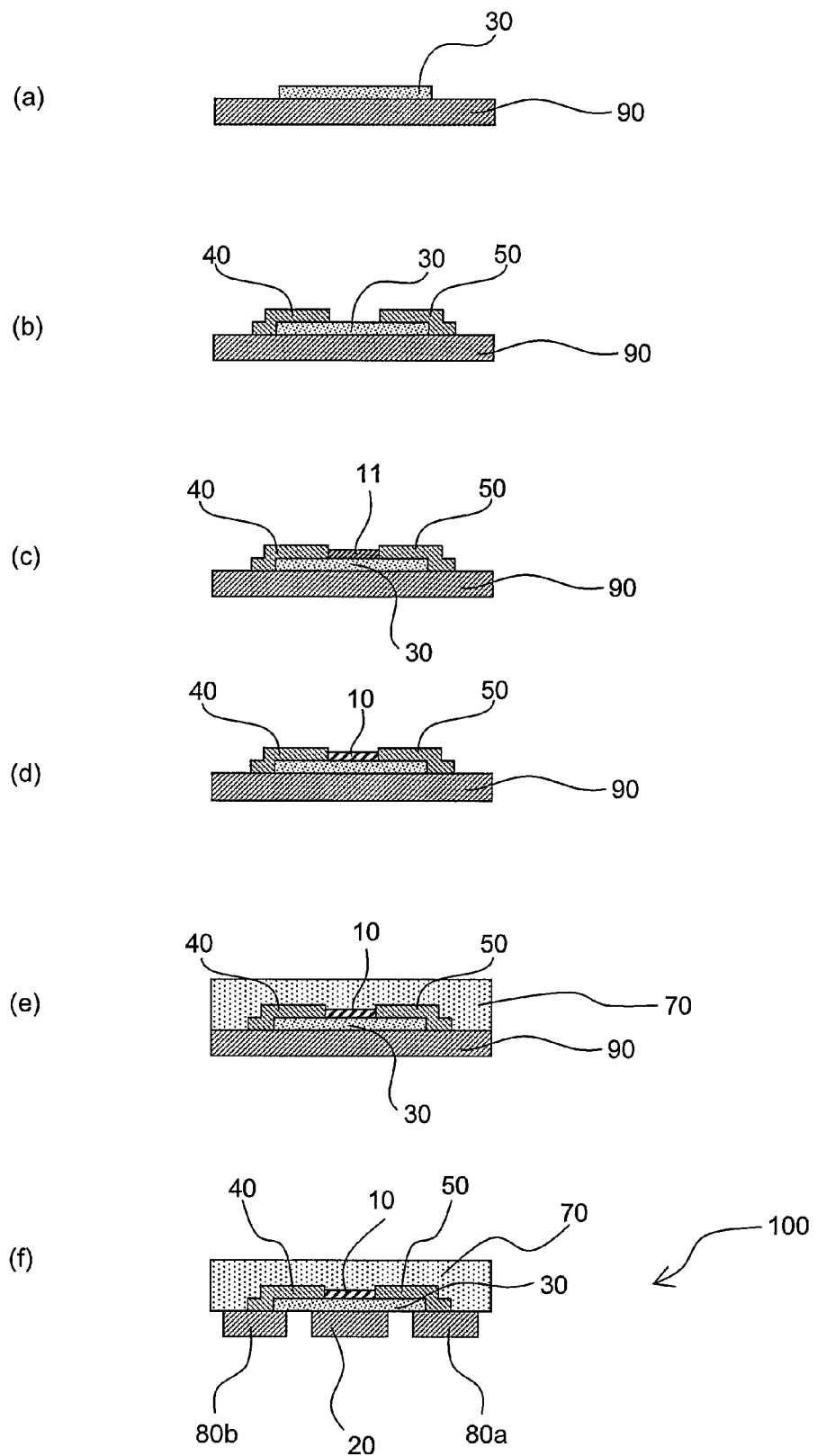
FIG. 9 illustrates cross-sectional views showing the steps in a manufacturing process of a thin film transistor according to Fifth Embodiment of the present invention.

First, a metal foil 90 is provided, and then a gate insulating layer 30 is formed on the metal foil 90, as shown in FIG. 9(a). A gate insulating layer 30 can be formed by a thin film formation method (e.g., a sputtering process) using a mask. Alternatively, the gate insulating layer 30 can be formed by applying the metal salt-containing composition for formation of gate insulating layer, followed by a heat treatment thereof.

Then, as shown in FIG. 9(b), a source electrode 40 and a drain electrode 50 are formed so that both ends of each electrode are in contact with the channel layer 10 and the metal foil 90 respectively. The formation of the source/drain electrodes can be performed by a vacuum deposition method or a sputtering method. Alternatively, the formation of the source/drain electrodes can be performed by applying the metal salt-containing composition for formation of source/drain electrodes, followed by a heat treatment thereof.

Then, as shown in FIG. 9(c), a channel precursor layer 11 is formed by applying the "metal salt-containing composition comprising a metal salt, a polyvalent carboxylic acid having a cis-form structure of —C(COOH)=C(COOH)— with a molar ratio of the polyvalent carboxylic acid to the metal salt being 0.5 to 4.0, an organic solvent and a water" on the gate insulating layer 30 to make contact with the source electrode 40 and the drain electrode 50. Thereafter, the channel precursor layer 11 is subjected to a heat treatment to form a channel layer 10 therefrom (see FIG. 9(d)).

Subsequently, as shown in FIG. 9(e), a sealing layer 70 is formed on an upper surface of the metal foil 90 such that it covers the channel layer 10, the gate insulating film 30, the source electrode 40 and the drain electrode 50. The formation of the sealing layer 70 can be performed by a similar way to that of Fourth Embodiment.

Finally, as shown in FIG. 9(f), the metal foil 90 having served as a supporting member is subjected to an etching process to form a gate electrode 20 and extraction electrodes 80a, 80b, which makes it possible to complete the manufacturing of the thin film transistor 100.

Figure 8:
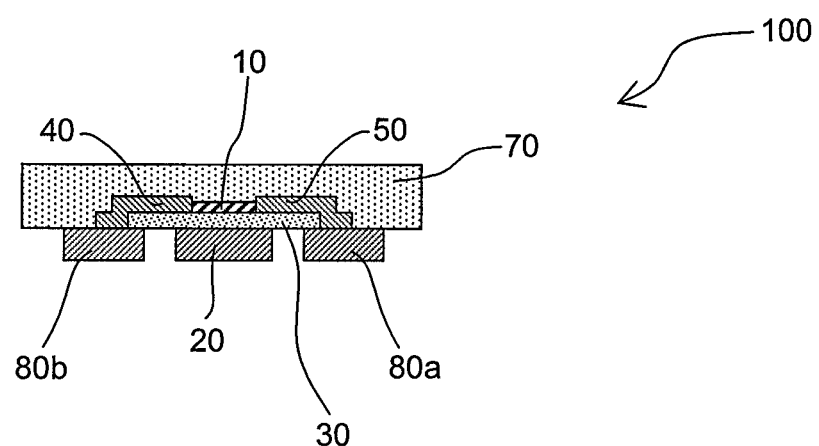
FIG. 8 illustrates cross-sectional views showing the steps in a manufacturing process of a thin film transistor according to Fifth Embodiment of the present invention.

The thin film transistor 100 thus produced according to Fifth Embodiment comprises the gate electrode 20, the channel layer 10, the gate insulating layer 30, the source electrode 40, the drain electrode 50, the sealing layer 70 and the extraction electrodes 80a, 80b as shown in FIG. 8. More specifically, the thin film transistor 100 is configured to have the gate electrode 20 and the extraction electrodes 80a, 80b, all of them being formed by partially etching away the metal foil, the channel layer 10, the gate insulating film 30 formed therebetween, the source electrode 40 and the drain electrode 50, each of which being in contact with the channel layer 10 and the extraction electrodes 80a, 80b respectively, the sealing layer 70 serving to enclose the channel layer 10, the source electrode 40 and the drain electrode 50.

<<Image Display Device>>

Figure 10:
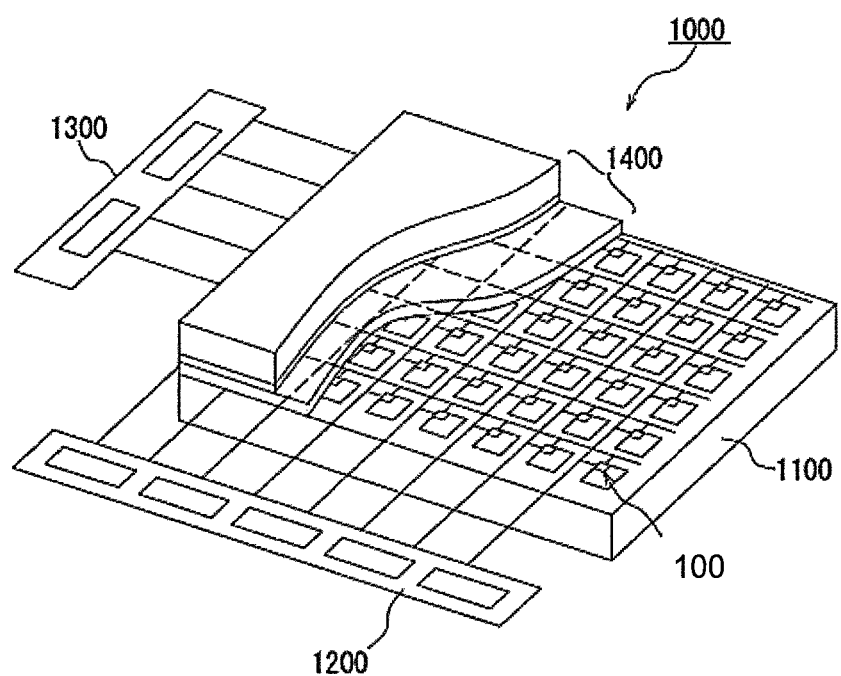
FIG. 10 illustrates a perspective view of an external appearance of an image display device.

An example of an image display device 1000 is shown in FIG. 10. FIG. 10 shows an external overall appearance of the image display device 1000.

The image display device 1000 is an organic electroluminescence display, for example. As illustrated, the image display device 1000 comprises a TFT unit 1100, a driver unit (1200, 1300) and an EL unit 1400. Each pixel of the TFT unit 1100 has the thin film transistor 100 according to any of the above First Embodiment to Fifth Embodiment.

Specifically, the thin film transistor 100 is provided under the organic EL element of the EL unit 1400, and the drain electrode 50 of a driving TFT element equipped with the thin film transistor 100 is in a connection with each organic EL device. The image display device has a transparent electrode on the organic EL element. Moreover, the image display device has a protective film (e.g., a resin film such as PET and PEN films) on the transparent electrode.

Although the embodiments of the present invention have been hereinbefore described, the present invention is not limited to those. It will be readily appreciated by those skilled in the art that various modifications are possible without departing from the scope of the present invention.

Figure 11:
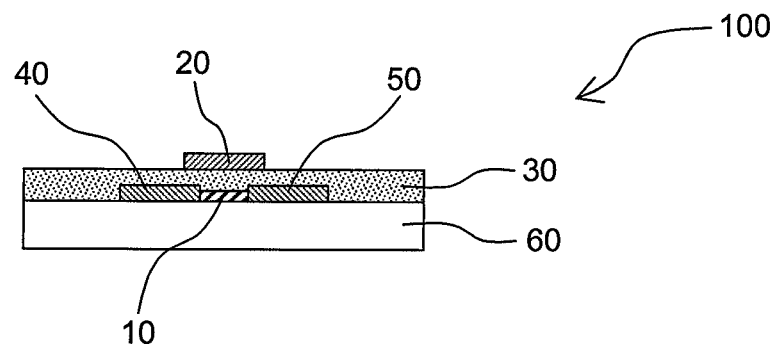
FIG. 11 illustrates a cross-sectional view showing the structure of a thin film transistor according to a modified embodiment of the present invention.

For example, a thin film transistor according to the present invention can be embodied in various kinds of forms. The representative examples thereof include thin film transistors 100 as shown in FIGS. 11 to 13:

The thin film transistor 100 shown in FIG. 11 is configured to have the source electrode 40 and the drain electrode 50 formed on the substrate 60, and the channel layer 10 formed between the source electrode 40 and the drain electrode 50, the channel layer 10 and the source and drain electrodes 40, 50 being in contact with each other. The gate insulating layer 30 is provided such that it covers the channel layer 10 and the source/drain electrodes 40, 50. On the upper surface of the gate insulating layer 30, the gate electrode 20 is provided at a position opposite to the channel layer 10. The formations of the channel layer 10, the gate insulating layer 30, the source electrode 40 and the drain electrode 50 can be performed by the same method as those of above First Embodiment to Third Embodiment.

Figure 12:
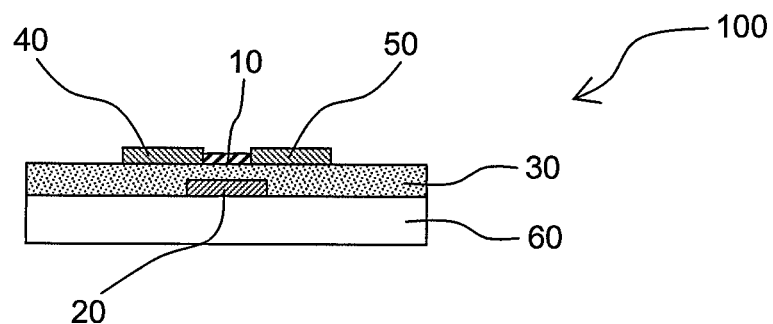
FIG. 12 is a sectional view showing the structure of a thin film transistor according to a modified embodiment of the present invention.

The thin film transistor 100 shown in FIG. 12 is configured to have the gate electrode 20 and the gate insulating film 30 formed on the substrate 60 in this order. The source electrode 40 and the drain electrode 50 are provided on the insulating film 30. The channel layer 10 is provided at a position opposite to the gate electrode 20 provided on the gate insulating film 30 such that the channel layer 10 is in contact with the source electrode 40 and the drain electrode 50. The formations of the channel layer 10, the gate insulating layer 30, the source electrode 40 and the drain electrode 50 can be performed by the same method as those of First Embodiment to Third Embodiment.

Figure 13:
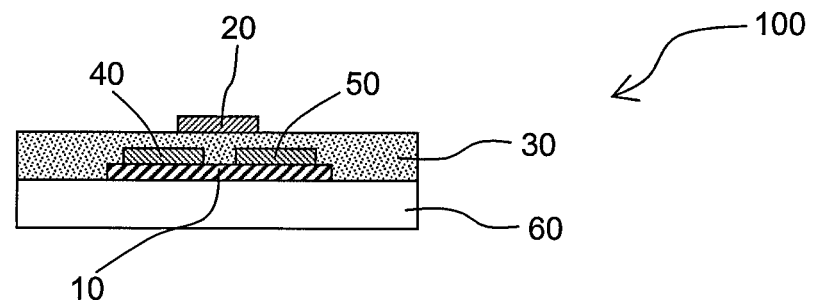
FIG. 13 is a sectional view showing the structure of a thin film transistor according to a modified embodiment of the present invention.

The thin film transistor 100 shown in FIG. 13 is configured to have the channel layer 10 formed on the substrate 60, the source electrode 40 and the drain electrode 50 formed thereon in contact with the channel layer 10. The gate insulating layer 30 is provided such that it covers the channel layer 11 and the source/drain electrodes 40, 50. The gate electrode 20 is provided on the gate insulating layer 30 at a position opposite to the channel layer 10. The formation of the channel layer 10, the gate insulating layer 30, the source electrode 40 and the drain electrode 50 can be performed by the same method as those of First Embodiment to Third Embodiment.

In general, the present invention as described above includes the following aspects:

The first aspect: A method for manufacturing a field-effect transistor comprising a gate electrode, a source electrode, a drain electrode, a channel layer and a gate insulating layer, wherein the channel layer is formed by using a metal salt-containing composition comprising:

a metal salt;

a polyvalent carboxylic acid having a cis-form structure of —C(COOH)=C(COOH)—;

an organic solvent; and a water wherein a molar ratio of the polyvalent carboxylic acid to the metal salt is in the range of 0.5 to 4.0 (i.e., between not less than 0.5 and not more than 4.0).

The second aspect: The manufacturing method according to the first aspect, wherein the polyvalent carboxylic acid is one or more selected from the group consisting of maleic acid, citraconic acid, phthalic acid and trimellitic acid.

The third aspect: The manufacturing method according to the first or second aspect, wherein the water is derived from a hydrate of the metal salt.

The fourth aspect: The manufacturing method according to any one of the first to third aspects, wherein the metal salt of the metal salt-containing composition is a salt of one or more metals selected from the group consisting of Mg, Ca, Sr, Ba, Y, Ti, Zr, Hf, Nb, Ta, Cr, W, Fe, Ni, Cu, Ag, Zn, Al, Ga, In, Sn and Sb.

The fifth aspect: The manufacturing method according to any one of the first to fourth aspects, wherein the metal salt of the metal salt-containing composition is a metal salt with at least Zn therein.

The sixth aspect: The manufacturing method according to the fifth aspect, wherein the metal salt of the metal salt-containing composition further comprises a salt of one or more metals selected from the group consisting of In and Ga.

The seventh aspect: The manufacturing method according to any one of the first to sixth aspects, wherein the metal salt is in a form of one or more salts selected from the group consisting of nitrate, sulfate, carboxylate, halide, alkoxide and acetylacetonate.

The eighth aspect: The manufacturing method of according to any one of the first to seventh aspects, the method comprising the steps of:

(i) forming the gate electrode on a substrate;

(ii) forming the gate insulating layer on the substrate such that the gate electrode is covered with the gate insulating layer;

(iii) supplying the metal salt-containing composition on the gate insulating layer to form a channel precursor layer, and then subjecting the channel precursor layer to a heat treatment to form the channel layer therefrom; and (iv) forming the source electrode and the drain electrode such that they are in contact with the channel layer.

The ninth aspect: The manufacturing method according to any one of the first to seventh aspects, the method comprising the steps of:

(i)' providing a metal foil;

(ii)' forming the gate insulating layer on the metal foil;

(iii)' supplying the metal salt-containing composition on the gate insulating layer to form a channel precursor layer, and then subjecting the channel precursor layer to a heat treatment to form the channel layer therefrom;

(iv)' forming the source electrode and the drain electrode such that they are in contact with the channel layer;

(v)' forming a sealing layer such that the channel layer, the source electrode and the drain electrode are covered with the sealing layer; and (vi)' subjecting the metal foil to an etching treatment to form the gate electrode therefrom.

The tenth aspect: The manufacturing method according to any one of the first to ninth aspects, wherein the metal salt-containing composition is further used for the formation of the gate insulating layer;

wherein the metal salt of the metal salt-containing composition to be used for the formation of the gate insulating layer is a salt of one or more metals selected from the group consisting of Ba, Y, Zr, Hf, Ta and Al.

The eleventh aspect: The manufacturing method according to any one of the first to tenth aspects, wherein the metal salt-containing composition is further used for the formation of the source electrode and/or the drain electrode;

wherein the metal salt of the metal salt-containing composition to be used for the formation of the source electrode and/or the drain electrode is a salt of an electrically-conductive metal.

The twelfth aspect: A field-effect transistor obtained by the manufacturing method according to any one of the first to eleventh aspects, comprising:

a channel layer;

a gate electrode;

a gate insulating layer positioned at least between the channel layer and the gate electrode; and a source electrode and a drain electrode which are located to be in contact with the channel layer, wherein the channel layer comprises a metal oxide formed from the metal salt-containing composition.

The thirteenth aspect: The field-effect transistor according to the twelfth aspect, wherein a surface of the channel layer has an arithmetic mean roughness (Ra) of not more than 10 nm.

The fourteenth aspect: The field-effect transistor according to the twelfth or thirteenth aspect when appendant to the fifth aspect, the metal oxide comprises Zn.

The fifteenth aspect: The field-effect transistor according to the fourteenth aspect when appendant to the sixth aspect, the metal oxide further comprises one or more metals selected from the group consisting of In and Ga.

The sixteenth aspect: The field-effect transistor according to the fourteenth or fifteenth aspect, wherein the metal oxide has a density of 4.0 to 5.5 g/cm$^3$.

The seventeenth aspect: The field-effect transistor according to any one of twelfth to sixteenth aspects, wherein the metal oxide is an amorphous oxide.

The eighteenth aspect: A field-effect transistor obtained by the manufacturing method according to any one of the twelfth to seventeenth aspects when appendant to the tenth aspect, wherein the gate insulating layer comprises a metal oxide formed from the metal salt-containing composition for the formation of the gate insulating layer, the metal oxide of the gate insulating layer being an oxide of one or more metals selected from the group consisting of Ba, Y, Zr, Hf, Ta, Al and Si.

The nineteenth aspect: A field-effect transistor obtained by the manufacturing method according to any one of the twelfth to eighteenth aspects when appendant to the eleventh aspect, wherein the source electrode and/or the drain electrode comprise(s) an electrically-conductive metal oxide formed from the metal salt-containing composition for the formation of the source electrode and/or drain electrode formation.

The twentieth aspect: The field-effect transistor according to any one of the twelfth to nineteenth aspects, wherein the field-effect transistor is a thin film transistor (TFT).

EXAMPLES

Confirmatory Test of Characteristics of Metal Oxide Thin Film

Example 1

0.8924 g (0.003 mol) of zinc nitrate hexahydrate, 0.5221 g (0.0045 mol) of maleic acid, 7.96 g of 3-methoxy-3-methyl-1-butanol (MMB: product name "SOLFIT Fine Grade", manufactured by Kuraray Co., Ltd.) were mixed with each other. The resulting mixture was subjected to an ultrasonic treatment in an ultrasonic bath for 10 to 30 minutes to prepare a solution having a metal salt content of 0.3 mol/L. That is, the solution of a metal salt-containing composition was prepared. The properties of the prepared solution were studied.

Then, the solution was applied on a glass slide (i.e., glass substrate) by a spin-coating process (2000 rpm×30 seconds), followed by being subjected to a first heat treatment in a blower drier (at 150° C. for 10 minutes). As a result, a thin film made of a metal composite was formed on a surface of the substrate. The external appearance of the thin film thus formed was observed. Thereafter, the substrate with the thin film formed thereon was subjected to a second heat treatment (i.e., sintering treatment) in an electric muffle furnace (at 500° C. for 30 minutes) under an air atmosphere. After the second heat treatment, the external appearance of the thin film made of the metal oxide thus formed on the substrate surface was observed. The thin film made of the metal composite and the thin film made of the metal oxide, respectively, had the thickness of 0.03 μm to 0.05 μm.

Examples 2 to 46

The same procedure as in Example 1 was carried out except that the kinds of the metal salt, the polyvalent carboxylic acid and the organic solvent as well as the molar ratio and the water content were changed. The external appearance of the substrate surface was observed after the first heat treatment and the second heat treatment. The concrete composition and the observation regarding Examples 1 to 46 are shown in Table 1.

Note that the term "Molar ratio" in Table 1 represents a molar ratio of the polyvalent carboxylic acid to the metal salt. The term "Appearance 1" represents an external appearance of the thin film made of the metal composite formed after the first heat treatment, and "Appearance 2" represents an external appearance of the thin film made of the metal oxide formed after the second heat treatment. The term "Cracking" represents a presence or absence of a cracking in the thin film made of the metal oxide at a point in time after the second heat treatment. In each of Examples 43 to 46, a mixture of two kinds of metal nitrates was used in an equimolar ratio.

With respect to 3-methoxy-3-methyl-1-butanol (MMB) in Table 1 as well as in Table 2, it contained 0.05% by weight of water.

TABLE 1

| Example | Metal | Anion | Polyvalent carboxylic acid | Molar ratio | Solvent | Water content of solution (wt %) | Property of solution | Appearance 1 | Appearance 2 | Cracking |
|---|---|---|---|---|---|---|---|---|---|---|
| 1 | Zn | NO$_3^-$ | Maleic acid | 1.5 | MMB | 4 | Transparent | Uniform | Uniform | None |
| 2 | | | | | MMB/Water = 90/10 (wt %) | 12.5 | | | | |
| 3 | | | Phthalic acid | | MMB | 4 | | | | |
| 4 | | | Trimellitic acid | | | | | | | |
| 5 | | | Citraconic acid | | | | | | | |
| 6 | | | Maleic anhydride | | MMB/Water = 90/10 (wt %) | 12.5 | | | | |
| 7 | | | Maleic acid | | Water | 86 | | | | |
| 8 | | | | 2 | | 84 | | | | |
| 9 | | | | 3 | | 81 | | | | |
| 10 | | | | 1.5 | Methanol | 4 | | | | |
| 11 | | | | | Ethanol | | | | | |
| 12 | | | | | Ethylene glycol | | | | | |
| 13 | | | | | Propylene glycol | | | | | |
| 14 | | | | | n-methyl-pyrrolidone | | | | | |
| 15 | | CH$_3$COO$^-$ | | | Water | 86 | | | | |
| 16 | | Acetylacetone | | | | | | | | |
| 17 | | Cl | | | | | | | | |
| 18 | | Br | | | | | | | | |
| 19 | | Butoxide | | | MMB | 0.08 | | | | |
| 20 | Ti | Isopropoxide | | | | | | | | |
| 21 | Mg | NO$_3^-$ | | | | | | | | |
| 22 | Ca | | | | | | | | | |
| 23 | Sr | | | | | | | | | |
| 24 | Ba | | | | | | | | | |

TABLE 1-continued

| Example | Metal | Anion | Polyvalent carboxylic acid | Molar ratio | Solvent | Water content of solution (wt %) | Property of solution | Appearance 1 | Appearance 2 | Cracking |
|---|---|---|---|---|---|---|---|---|---|---|
| 25 | Y | | | | | | | | | |
| 26 | Ti | | | | | | | | | |
| 27 | Zr | Butoxide | | | | | | | | |
| 28 | Hf | $NO_3^-$ | | | | | | | | |
| 29 | Nb | | | | | | | | | |
| 30 | Ta | | | | | | | | | |
| 31 | Cr | | | | | | | | | |
| 32 | W | | | | | | | | | |
| 33 | Fe | | | | | | | | | |
| 34 | Ni | | | | | | | | | |
| 35 | Cu | | | | | | | | | |
| 36 | Ag | | | | | | | | | |
| 37 | Al | | | | | | | | | |
| 38 | Ga | | | | | | | | | |
| 39 | In | | | | | | | | | |
| 40 | Si | Ethoxide | | | | | | | | |
| 41 | Sn | $NO_3^-$ | | | | | | | | |
| 42 | Sb | | | | | | | | | |
| 43 | In + Sn | | | | | | | | | |
| 44 | In + Zn | | | | | | | | | |
| 45 | Sn + Zn | | | | | | | | | |
| 46 | Sb + Sn | | | | | | | | | |

Comparative Examples 1 to 13

The same procedure as in Example 1 was performed by using zinc nitrate as the metal salt and also by mainly varying the kinds and amount of the carboxylic acid. The observation similar to that of Example 1 was conducted. The results are shown in Table 2. The thin film made of the metal composite and the thin film made of the metal oxide, which had been formed on the surface of the substrate, had the thickness of 0.05 μm to 1 μm, respectively.

liquid. Accordingly, the solution was capable of being uniformly applied on a glass slide by a spin-coating process. As for the thin film made of the metal composite formed on the substrate after the first drying treatment, there were observed a uniform film, no white turbidity and no cracking.

While on the other hand, in Comparative Examples 7 to 9, 11 and 12, the dissolving of the metal salt and the carboxylic acid into the organic solvent was unlikely to occur, or they readily turned into the gel upon mixing of them, which made it impossible to apply them on the glass slide by a spin-

TABLE 2

| Comparative example | Metal | Anion | Carboxylic acid etc. | Molar ratio | Solvent | Water content of solution (wt %) | Property of solution | Appearance 1 | Appearance 2 |
|---|---|---|---|---|---|---|---|---|---|
| 1 | Zn | $NO_3^-$ | None | 0 | MMB | 4 | Transparent | White turbidity, Cracking | White turbidity, Cracking |
| 2 | | | Maleic acid | 0.2 | | | | Non-uniformity | Non-uniformity |
| 3 | | | | 5 | | | | | |
| 4 | | | Fumaric acid | 1.5 | | | | White turbidity, Cracking | White turbidity, Cracking |
| 5 | | | Succinic acid | | | | | | |
| 6 | | | Succinimide | | | | | | |
| 7 | | | Isophthalic acid | | | | Insoluble | Uncoatable (Inapplicable) | Uncoatable (Inapplicable) |
| 8 | | | Terephthalic acid ■ | | | | | | |
| 9 | | | Pyromellitic acid ■ | | | | Gelation | | |
| 10 | | | Citric acid | | | | Transparent | White turbidity, Cracking | White turbidity, Cracking |
| 11 | | | Oxalic acid ■ | | | | Gelation | Uncoatable (Inapplicable) | Uncoatable (Inapplicable) |
| 12 | | | Diethanolamine | | | | | | |
| 13 | | | Acetylacetone | | | | Transparent | White turbidity, Cracking | White turbidity, Cracking |

In each of Examples 1 to 46, the mixture of the metal salt and the polyvalent carboxylic acid having a cis-form structure of —C(COOH)═C(COOH)— with a molar ratio of the polyvalent carboxylic acid to the metal salt being 1.5 was dissolved into an organic solvent. As the property of the resulting solution (i.e., metal salt-containing composition) in each Example, the solution was found to be in a form of transparent coating process. Moreover, as for each of the Comparative Examples other than the above Comparative Examples, a transparent solution was produced, but the white turbidity of the film, non-uniformity and cracking of the surface thereof were observed after the first heat treatment. Such properties of the substrate still remained at a point in time after the second heating treatment.

<Metal Composite Formed after First Drying Treatment>

0.8924 g (0.003 mol) of zinc nitrate hexahydrate, 0.5221 g (0.0045 mol) of maleic acid, 7 g of methanol and 1 g of water were mixed with each other, followed by being treated by means of an ultrasonic bath for 10 to 30 minutes to form a solution therefrom. Thereafter, the solvent of the resulting solution was subjected to a evaporation treatment to form a sickly white powder. This powder was then subjected to a heat treatment at 150° C. for 10 minutes, which causes the color of the powder to change into somewhere between yellow and brown.

This powder having the above color was dissolved in $CDCl_3$ solution, and the resulting solution was subjected to a $^1$H-NMR spectrum measurement. As a result, it was found that no peak appeared in this $^1$H-NMR spectrum measurement. While on the other hand, the powder was dissolved in $D_2O$ solution, and the resulting solution was subjected to a 1H-NMR spectrum measurement. In this measurement, a peak was observed at a position of a chemical shift, indicating a lower magnetic field shift compared with that of the NMR spectrum for maleic acid only.

In a case where a maleic acid with no zinc bound thereto exists, the NMR spectrum of the maleic acid should be observed in a sample having the above yellowish to brownish powder dissolved in $CDCl_3$ solution, due to the fact that the maleic acid can dissolve into the $CDCl_3$ solution. However, as a matter of fact, since no NMR spectrum of maleic acid was observed. Therefore, the above powder was inferred to be a complex of zinc and maleic acid at a ratio of 1:1 in light of the fact of the chemical shift of the spectrum regarding a case when dissolved in $D_2O$ solution.

The similar studies to the above were conducted using a solution wherein a salt of a divalent metal other than "zinc" and a polyvalent carboxylic acid other than "maleic acid" having a cis-form structure of —C(COOH)=C(COOH)— were dissolved in an organic solvent. As a result, the chemical shift of the NMR spectrum, inferred to be the complex of zinc and maleic acid at a ratio of 1:1, was observed. Therefore, it was inferred that the thin film of the metal composite represented by the following chemical formula had been formed on the substrate surface at a point in time after the first drying treatment. Note that "M" in the formula represents a divalent metal.

[Chemical Formula]

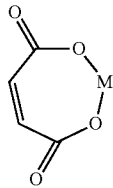

<Electron Micrograph of Substrate Surface>

Figure 14:
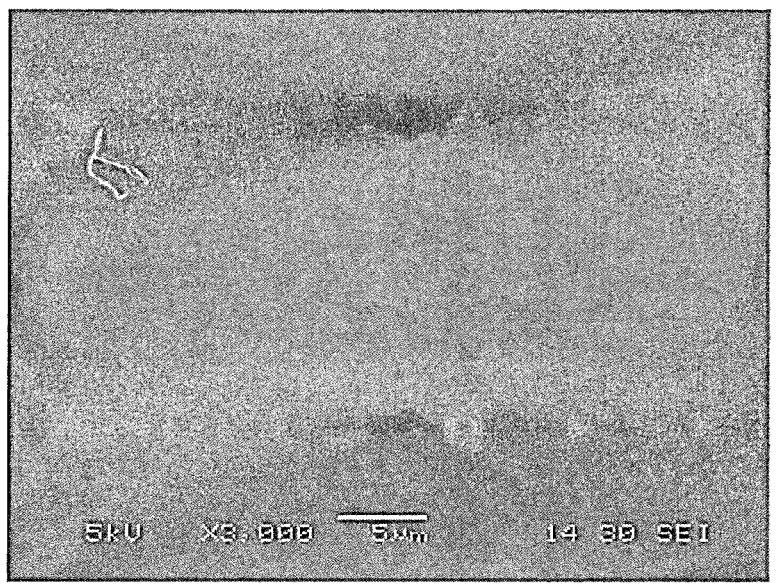
FIG. 14 is a SEM photograph of the surface of the substrate after a primary heating thereof in Example 1.
Figure 15:
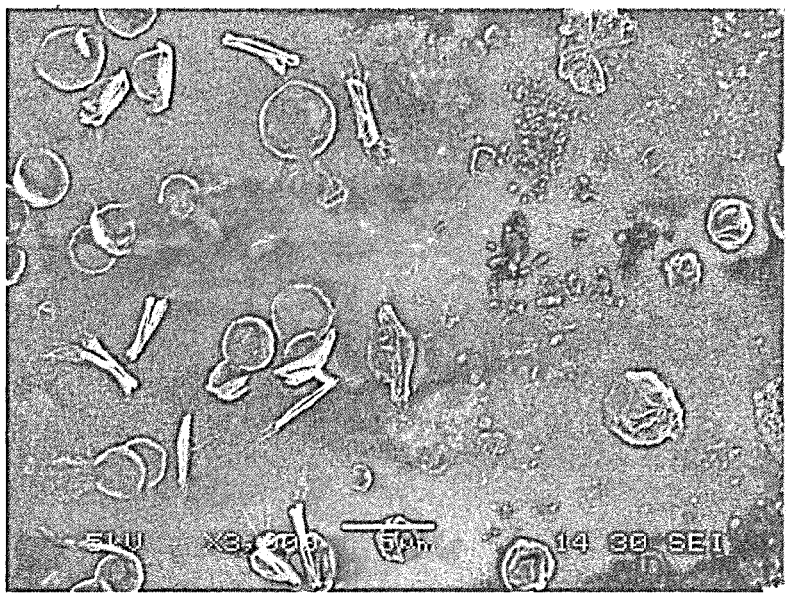
FIG. 15 is a SEM photograph of the surface of the substrate after a primary heating thereof in Comparative Example 1.
Figure 16:
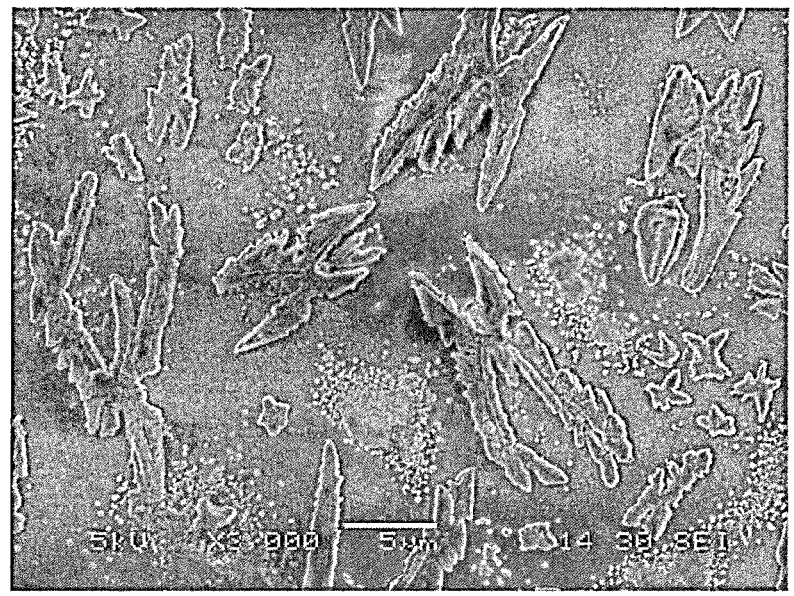
FIG. 16 is a SEM photograph of the surface of the substrate after a primary heating thereof in Comparative Example 4.
Figure 17:
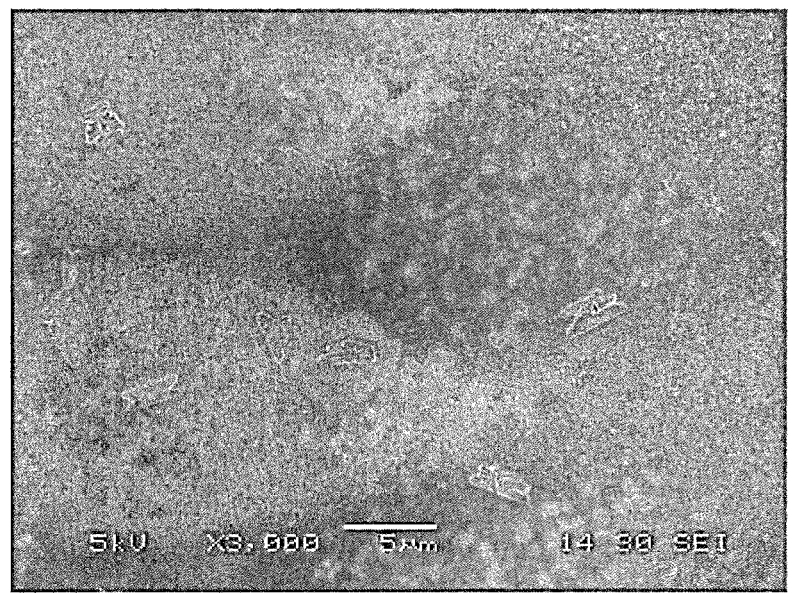
FIG. 17 is a SEM photograph of the surface of the substrate after a primary heating thereof in Comparative Example 5.

FIG. 14 shows a scanning electron microscope (SEM) photograph of the surface (i.e., surface wherein the application was performed by a spin-coating process) of the substrate prepared in Example 1 at a point in time after the first heat treatment. While on the other hand, each of FIGS. 15, 16 and 17 shows a SEM photograph of the surface (i.e., surface wherein the application was performed by a spin-coating process) of the substrate prepared in Comparative Examples 1, 4 and 5 at a point in time after the first heat treatment.

It was confirmed that the surface of the substrate was uniform, and that a densified thin film of metal composite had been formed in the case of Example 1. While on the other hand, it was confirmed that aggregates had been formed, and that a lower-density film had been formed in the case of Comparative Example 1. Similarly, it was confirmed that aggregates had been formed in the substrate in the case of Comparative Example 4. It was also confirmed that aggregates had been formed and a dense and uniform film had not been formed in the case of Comparative Example 5.

Figure 18:
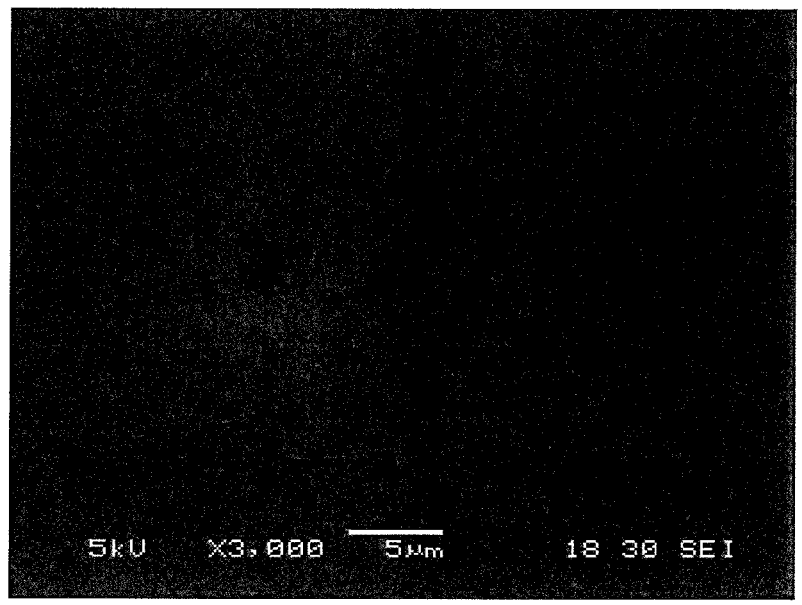
FIG. 18 is a SEM photograph of the surface of the substrate after a secondary heating thereof in Example 1.
Figure 19:
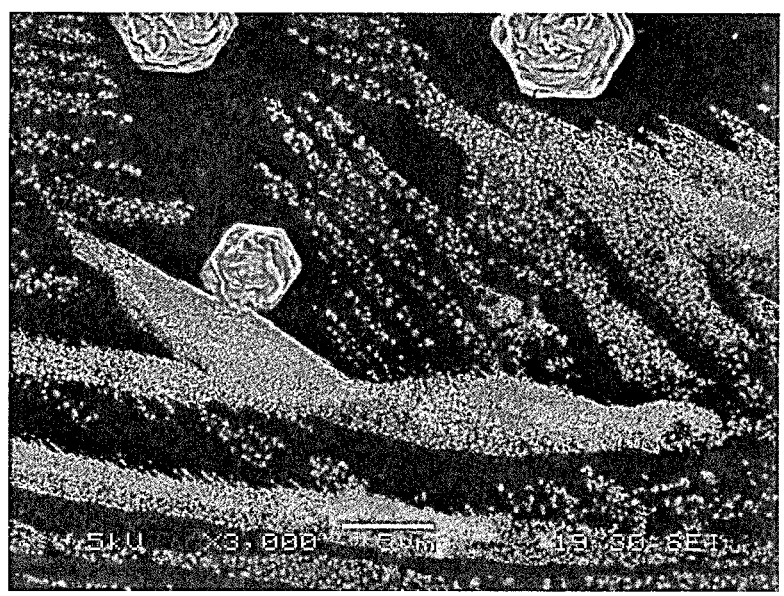
FIG. 19 is a SEM photograph of the surface of the substrate after a secondary heating thereof in Comparative Example 1.
Figure 20:
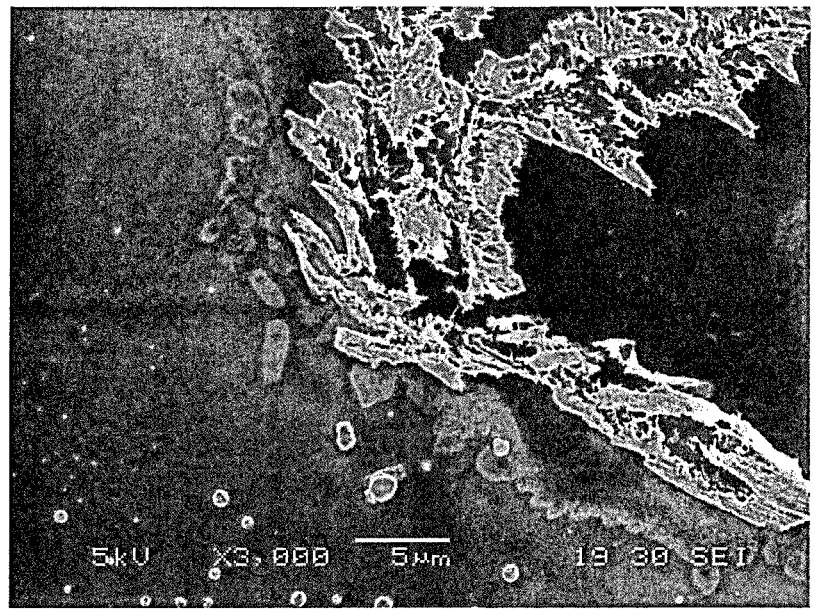
FIG. 20 is a SEM photograph of the surface of the substrate after the secondary hating thereof in Comparative Example 4.
Figure 21:
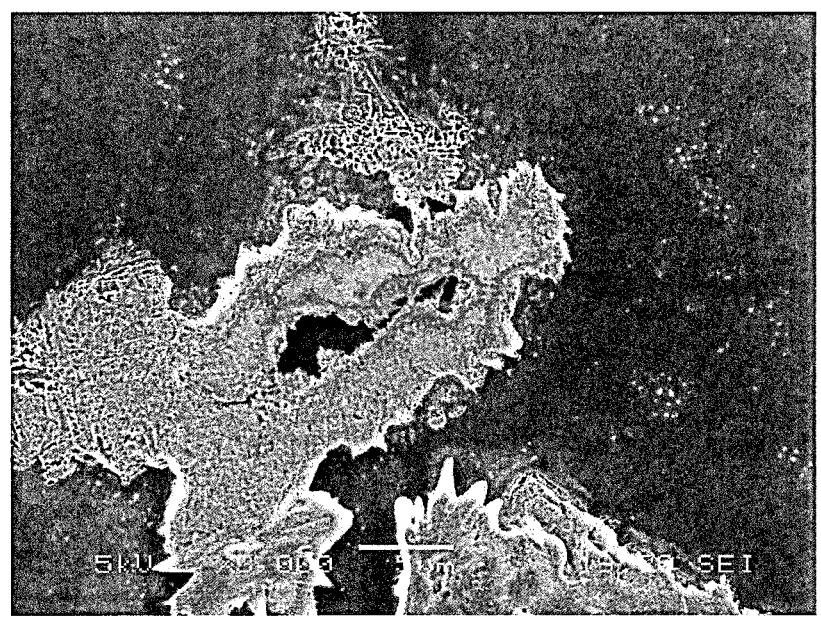
FIG. 21 is a SEM photograph of the surface of the substrate after the secondary heating thereof in Comparative Example 5.

FIG. 18 shows a scanning electron microscope (SEM) photograph of the surface (i.e., surface wherein the application was performed by a spin-coating process) of the substrate prepared in Example 1 at a point in time after the second heat treatment. While on the other hand, each of FIGS. 19, 20 and 21 shows a SEM photograph of the surface (i.e., surface wherein the application was performed by a spin-coating process) of the substrate prepared in Comparative Examples 1, 4 and 5 at a point in time after the second heat treatment.

It was confirmed that the surface of the substrate had been uniform, and that a densified thin film of metal oxide had been formed in the case of Example 1. While on the other hand, the substrates were non-uniform and many cracking were observed, and thereby a practical value of each substrate equipped with the thin film of the metal oxide was not recognized in the case of Comparative Examples 1, 4 and 5.

<Temperature of Second Heat Treatment>

The temperature of the second heat treatment is required to be 400° C. or higher. In this regard, the temperature of the second heat treatment was 500° C. in the above Examples. An upper limit temperature of the second heat treatment is preferably decided according to the heat-resistant temperature of the substrate. In a case where the heat-resistant temperature of the substrate is lower than that of the glass slide, the second heat treatment is preferably performed at a temperature close to 400° C. In a contrasting case where the heat-resistant temperature is higher than that of the glass slide, the second heat treatment can be performed at a temperature close to the heat-resistant temperature of the substrate.

Effect of First Heat Treatment

Comparative Example 14

The same procedure as in Example 1 was performed except that the prepared solution was spin-coated on the glass slide and the substrate was heated (i.e., a sintering process was performed) in an electric muffle furnace (at 500° C. for 30 minutes) under an air atmosphere without the use of the blower drier heating (at 150° C. for 10 minutes). The external appearance of the thin film of metal oxide formed on the surface of the substrate was observed. In other words, Comparative Example 14 was performed to form the thin film of the metal oxide on the substrate under such a condition that the first heat treatment was omitted from the procedures of Example 1.

Figure 22:
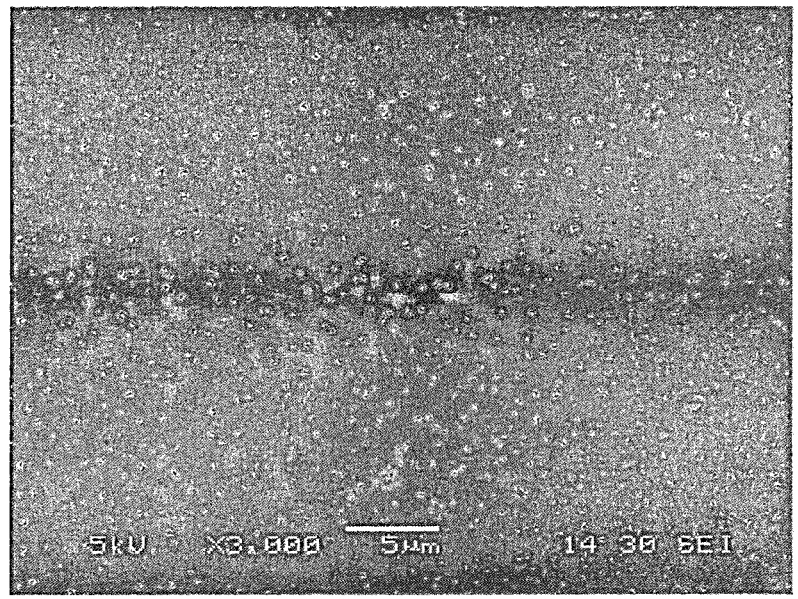
FIG. 22 is a SEM photograph of the surface of the substrate in Comparative example 14.

As a result of observing the external appearance of the surface (i.e., surface wherein the application was performed by a spin-coating process) of the substrate in Comparative Example 14, it was found that the uniformity had occurred to some extent, but mottled portions had emerged wholly. Consequently, a practical value of the substrate on which the metal oxide thin film had been formed was not recognized. FIG. 22 shows an electron micrograph of the surface of the thin film in Comparative Example 14. It was confirmed by this SEM photograph that the finer cracking had occurred.

By comparison between Example 1 and Comparative Example 14 wherein the same solution was applied on each of the substrates, it was confirmed that the thin film of a dense and uniform metal oxide could not be provided on the substrate unless the first heat treatment and the second heat treatment had been sequentially performed at their predetermined temperatures.

Effect of Water Content

Comparative Example 15

Figure 23:
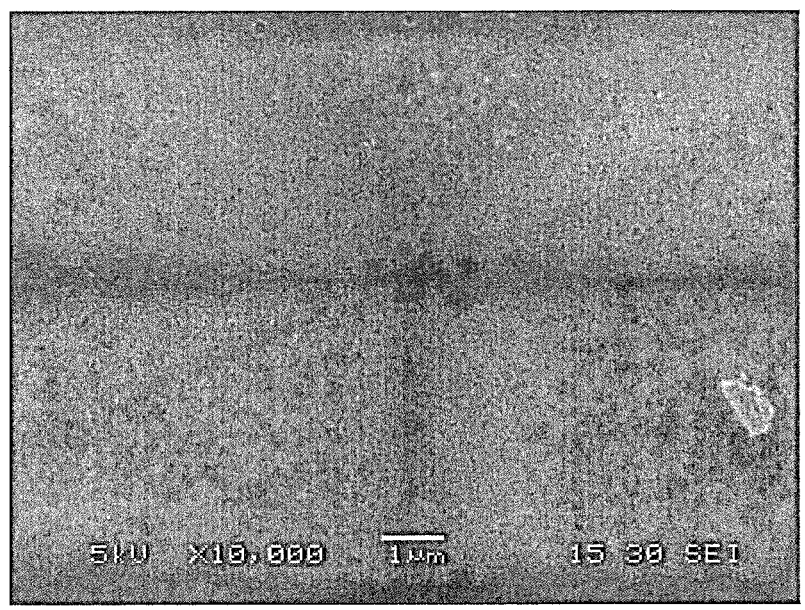
FIG. 23 is a SEM photograph of the surface of the substrate in Comparative example 15.

The same procedure as in Example 1 was performed except that the water content of the solution was 0.03% by weight. The external appearance was observed and a SEM photograph was taken in a similar manner to Example 1. As a result, it was found that the external appearance had been uniform to some extent, but the fine cracking had wholly occurred. The SEM photograph of the substrate surface (i.e., surface wherein the application was performed by a spin-coating process) prepared in Comparative Examples 15 is shown in FIG. 23.

By the comparison between Example 1 and Comparative Example 15, it was confirmed that the thin film of the dense and uniform metal oxide could not be provided on the substrate unless the solution to be applied had contained a moisture content.

<<Confirmatory Test of Film Density>>

A density of the metal oxide film according to the present invention was studied. Specifically, the film obtained by applying the metal salt-containing composition, followed by a heating thereof under the following conditions was studied in terms of its density:

Measuring method: XRR (X-ray reflectivity measurement)

Apparatus: X-ray diffraction apparatus (manufactured by Smart Lab Rigaku), Cu—Kα ray Film density was calculated by a fitting procedure using the software (GlobalFit)

Solution to be applied: Mixture solution which contained metal salt made from In, Zn and Ga (in such an equimolar ratio condition that mol regarding each metal was 0.1M and thus a total concentration was 0.3M), MMB, maleic acid and 10% by weight of water Metal oxide film: Metal oxide film obtained by spin-coating (2000 rpm) the solution onto a Si(100) wafer, followed by being dried at 150° C. for 10 minutes and then being subjected to a sintering treatment at 550° C. for 30 minutes.

Figure 24:
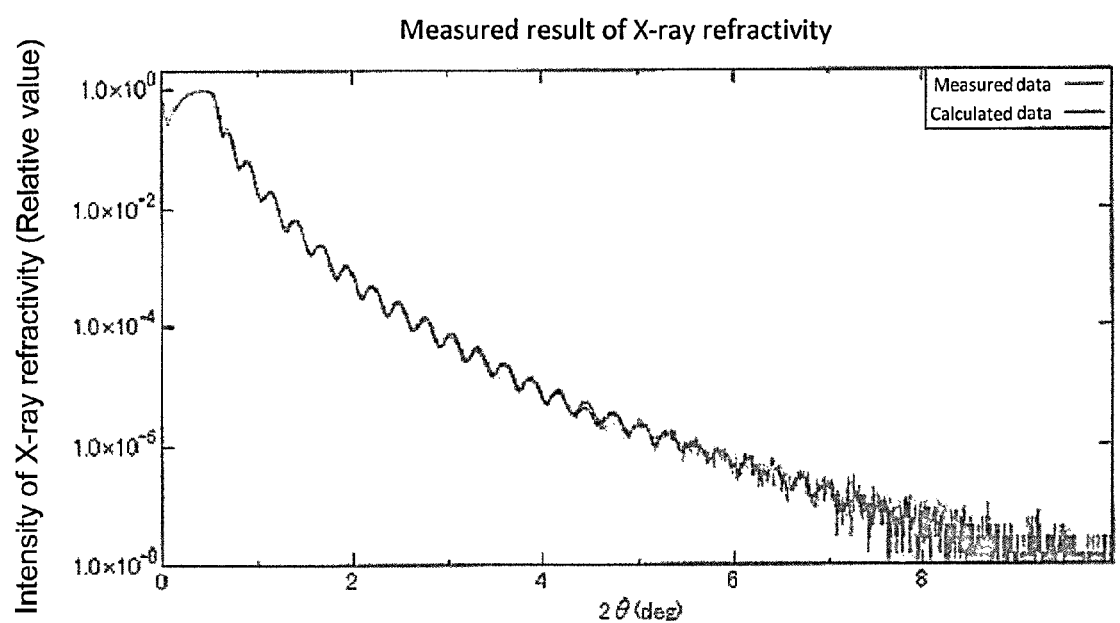
FIG. 24 is a graph chart showing a result of an X-ray reflectivity measurement.

The result of X-ray reflectivity measurement is shown in FIG. 24. Through this confirmatory test, the following matter was confirmed, and thus it was concluded that the metal oxide film (i.e., channel layer and so forth) obtained by the present invention was a densified one.

The film density calculated by fitting procedure: 4.392 g/cm$^3$ (film thickness calculated by fitting procedure: 30.9 nm)

Densities of the metal oxide films examined by using several kinds of solutions: about 4.3 g/cm$^3$ to about 4.8 g/cm$^3$ <<Confirmatory Test of Film Flatness>>

The metal oxide film according to the present invention was studied in terms of its flatness. Specifically, a surface of each film was observed by AFM (atomic force microscope) regarding the following two kinds of films. Note that nano-R2 (manufactured by Pacific Nanotechnology Co.) was used as a measurement apparatus.

Example 47

Present Invention

Solution to be applied: Mixture solution which contained metal salt of In, Zn and Ga (in such an equimolar ratio condition that mol regarding each metal was 0.1M and thus a total concentration was 0.3M), MMB, maleic acid and 10% by weight of water.

Metal oxide film: Metal oxide film obtained by spin-coating (2000 rpm) the solution onto a Si(100) wafer, followed by being dried at 150° C. for 10 minutes and then being subjected to a sintering treatment at 550° C. for 30 minutes.

Comparative Example 16

No Polyvalent Carboxylic Acid

Solution to be applied: Mixture solution which contained metal salt of In, Zn and Ga (in such an equimolar ratio condition that mol regarding each metal was 0.1M and thus a total concentration was 0.3M), MMB and 10% by weight of water.

Metal oxide film: Metal oxide film obtained by spin-coating (2000 rpm) the solution on Si(100) wafer, followed by being dried at 150° C. for 10 minutes and then being subjected to a sintering treatment at 550° C. for 30 minutes.

Figure 25:
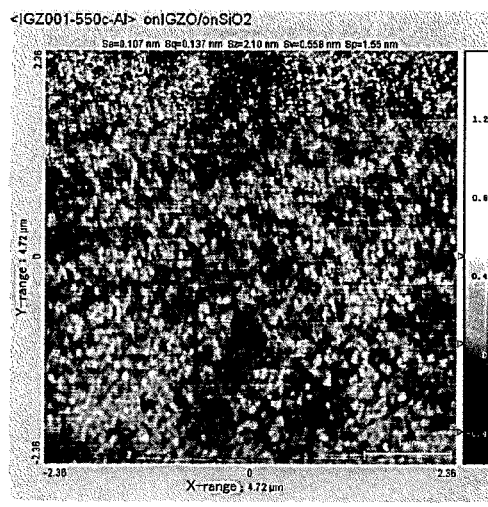
FIG. 25 is a result of a surface observation using an atomic force microscope (AFM).
Figure 25:
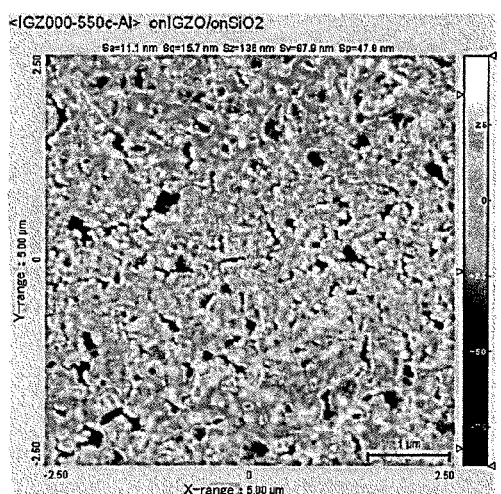
Figure 26:
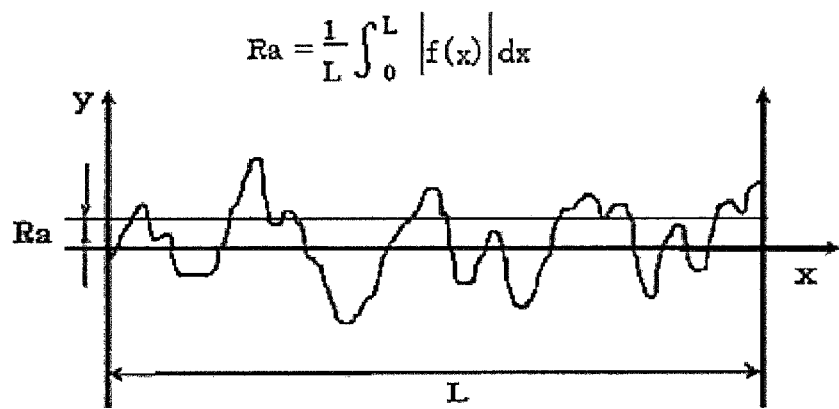
FIG. 26 is a graph chart for explaining an arithmetic mean roughness (Ra).

The result of the surface observation using AFM is shown in FIG. 25. As can be seen from the result of FIG. 25, it was found that a film flatness of the metal oxide film in a case of Example 47 (the present invention) had been improved compared with that of Comparative Example 16 (no polyvalent carboxylic acid). Specifically, the arithmetic mean surface roughness (Ra) of the metal oxide film in Example 47 (i.e., the case of the present invention) was 0.11 nm, and while on the other hand, the arithmetic mean surface roughness (Ra) of the metal oxide film in Comparative Example 16 (no polyvalent carboxylic acid) was 11.1 nm. Note that each of the above values regarding the arithmetic mean surface roughness (Ra) was a value that had been calculated by using a scanning probe image processor "SPIP" (manufactured by Image Metrology A/S) (see FIG. 26 regarding "Ra").

<<Confirmatory Test of Transistor Performance>>

Figure 27:
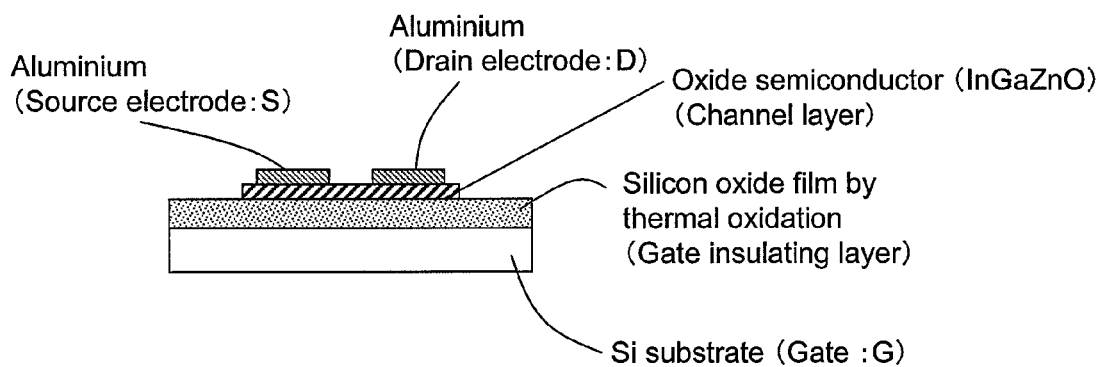
FIG. 27 is a drawing for explaining a confirmatory test of a transistor performance.

In order to confirm a performance of the transistor obtained by the present invention, the confirmatory test was carried out based on the following procedures (see FIG. 27):

A semiconductor film was formed by spin-coating (2000 rpm) the solution (i.e., solution used in the "Confirmatory Test of Film Density") onto a Si substrate equipped with a heat oxidized film having a thickness of 300 nm, followed by being dried at 150° C. for 10 minutes and then being subjected to a sintering treatment at 550° C. for 30 minutes.

The source/drain electrodes were formed by depositing aluminum with use of a mask.

The semiconductor performance was measured by using the silicon substrate as a gate electrode.

The semiconductor performance was measured by using a semiconductor parameter analyzer (B1500A, manufactured by Agilent Technologies).

The drain current (Id) was measured while varying the gate voltage (Vg) under such a condition that the drain voltage (Vd) was set at 1V and 10V, respectively.

Figure 28:
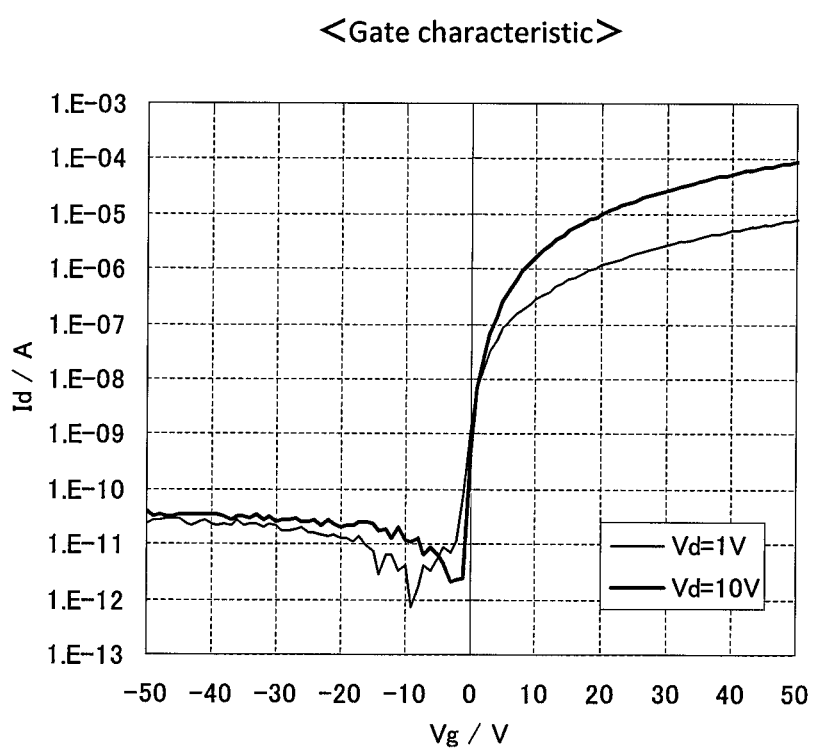
FIG. 28 is graph chart showing the result of a confirmatory test of a transistor performance.

FIG. 28 shows a graph regarding the results of this test. It was found by the graph of FIG. 28 that the semiconductor film obtained according to the present invention could exhibit a superior performance in terms of that of a channel layer of a thin film transistor.

INDUSTRIAL APPLICABILITY

Figure 29:
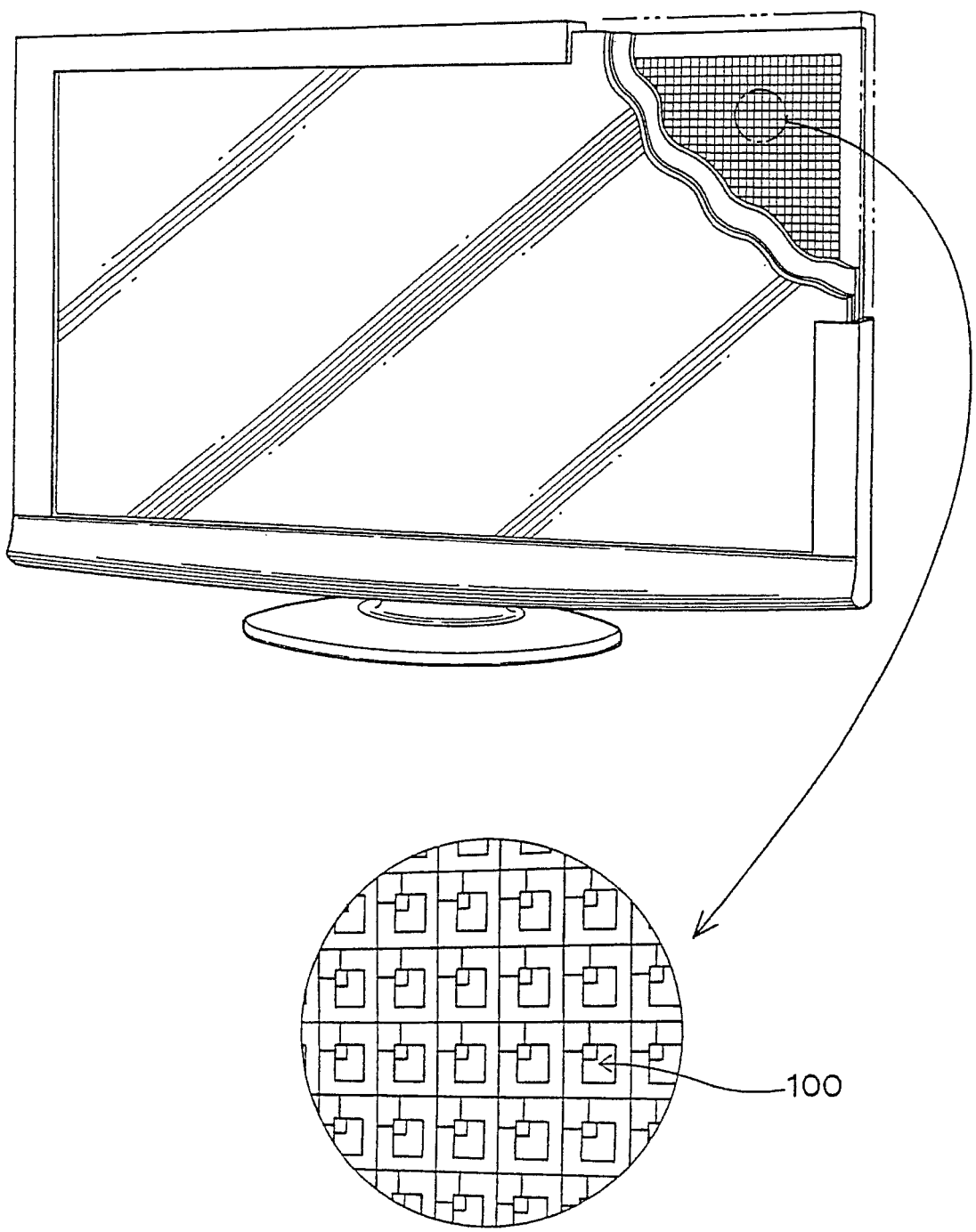
FIG. 29 illustrates an example of a product (an image display part of a television) wherein a field-effect transistor of the present invention is used.
Figure 30:
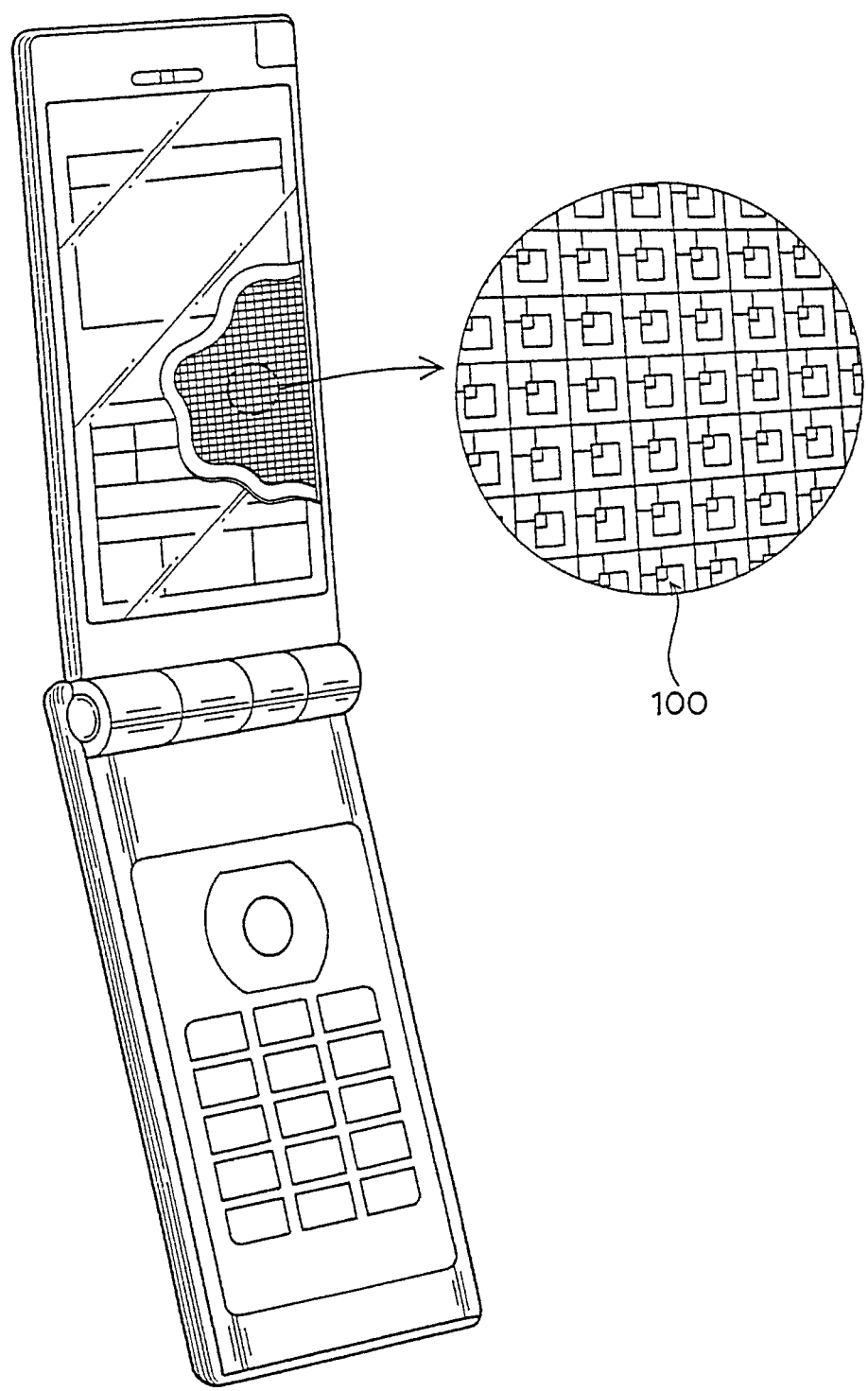
FIG. 30 illustrates an example of a product (an image display section of a cellular phone) wherein a field-effect transistor of the present invention is used.
Figure 31:
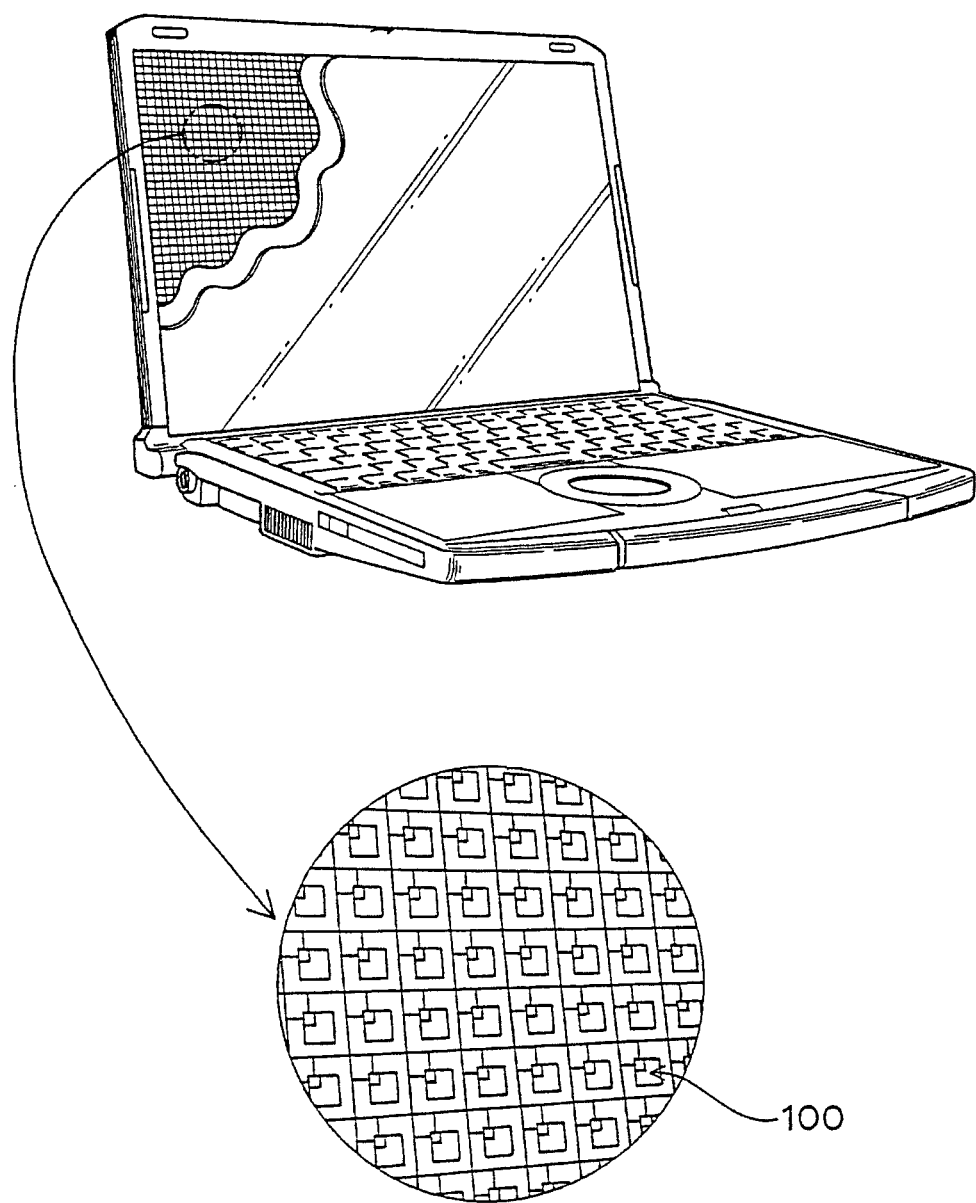
FIG. 31 illustrates an example of a product (an image display section of a mobile personal computer or a laptop computer) wherein a field-effect transistor of the present invention is used.
Figure 32:
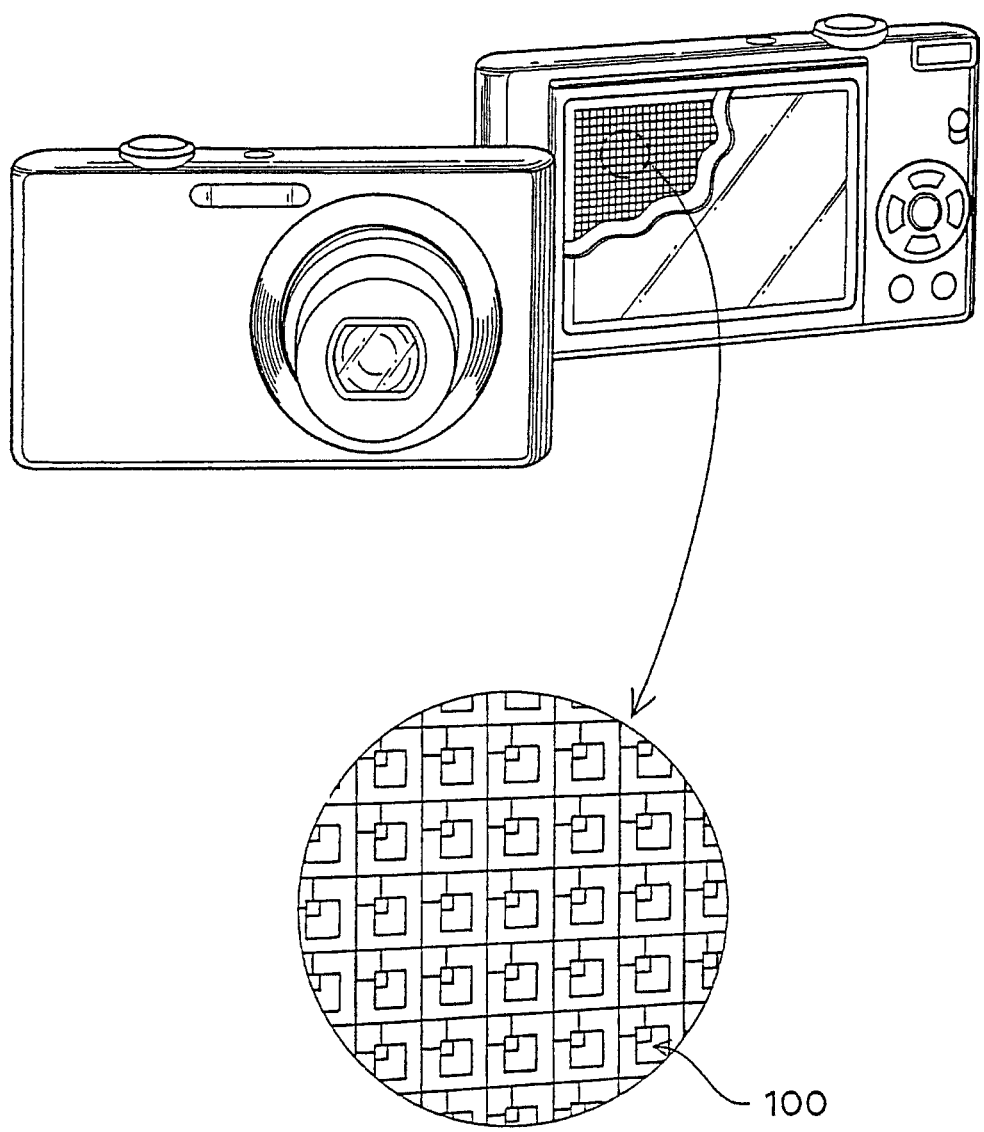
FIG. 32 illustrates an example of a product (an image display section of a digital still camera) wherein a field-effect transistor of the present invention is used.
Figure 33:
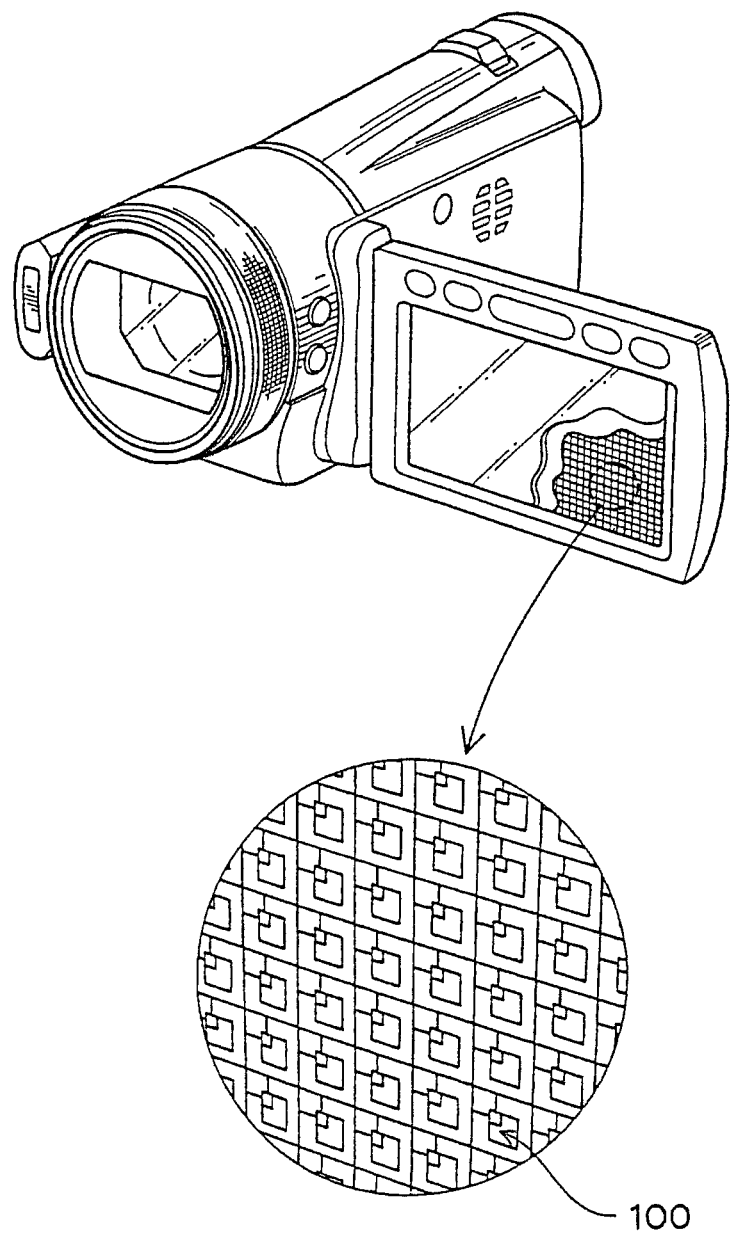
FIG. 33 illustrates an example of a product (an image display section of a camcorder) wherein a field-effect transistor of the present invention is used.
Figure 34:
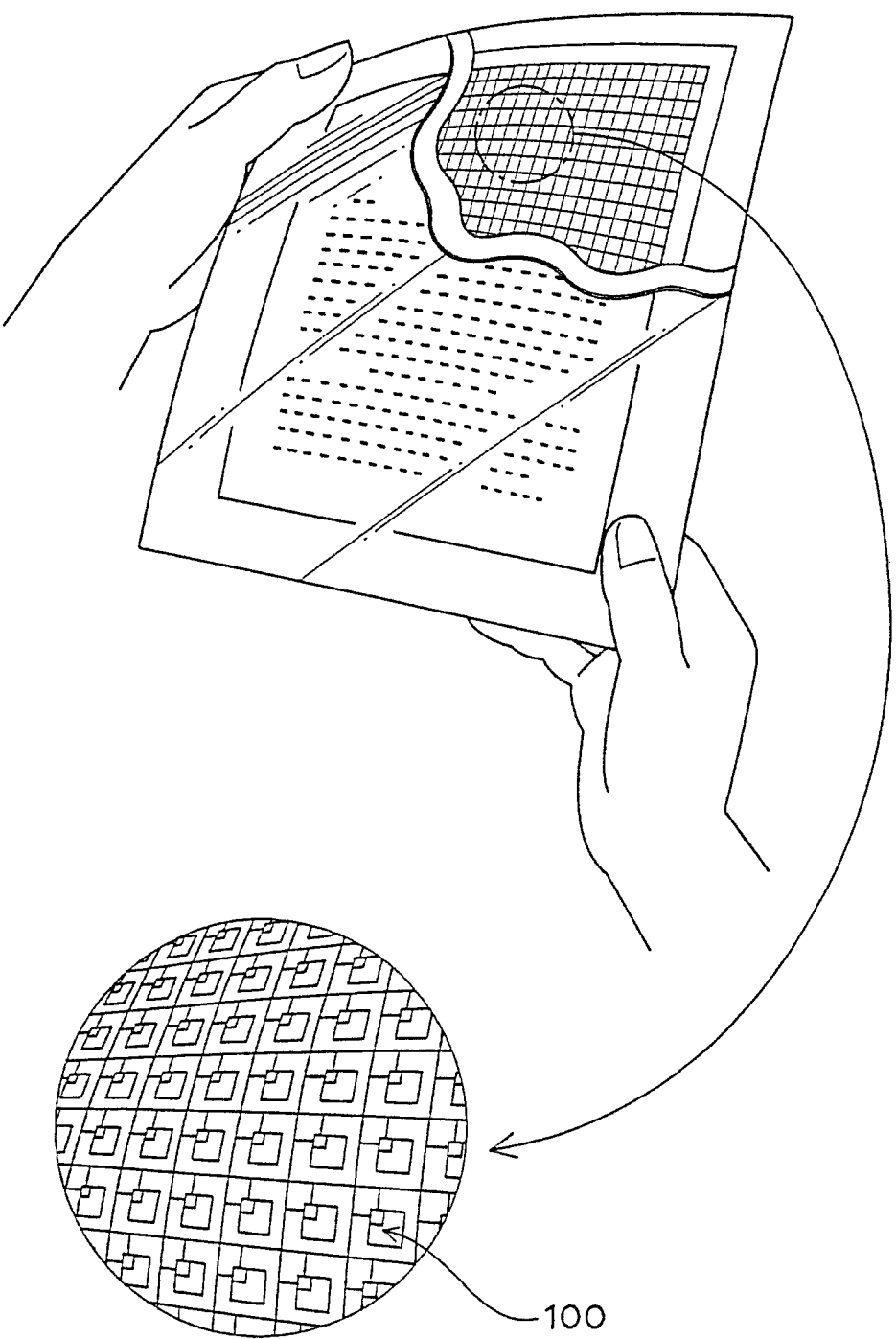
FIG. 34 illustrates an example of a product (an image display section of an electronic paper) wherein a field-effect transistor of the present invention is used.

The manufacturing method of the present invention is excellent in a productivity of a field-effect transistor. The field-effect transistor according to the present invention can also be used for various image display parts, and also can be used for an electronic paper, a digital paper and so forth. For example, the field-effect transistor can be used for a television picture indicator as shown in FIG. 29, the image display part of a cellular phone as shown in FIG. 30, the image display part of a mobile personal computer or a notebook computer as shown in FIG. 31, the image display part of a digital still camera and a camcorder as shown in FIGS. 32 and 33, the image display part of an electronic paper as shown in FIG. 34 and so forth. The field-effect transistor obtained by the manufacturing method of the present invention can also be adapted for the various uses (for example, RF-ID, a memory, MPU, a solar battery, a sensor and so forth).

The invention claimed is:

1. A method for manufacturing a field-effect transistor comprising a gate electrode, a source electrode, a drain electrode, a channel layer and a gate insulating layer, the method comprising:
   forming the channel layer by using a metal salt-containing composition comprising:
      a metal salt;
      a polyvalent carboxylic acid having a cis-form structure of —C(COOH)=C(COOH)—;
      an organic solvent; and
      water,
   wherein a molar ratio of the polyvalent carboxylic acid to the metal salt is in a range of 0.5 to 4.0.

2. The method according to claim 1, wherein the polyvalent carboxylic acid is one or more selected from a group consisting of maleic acid, citraconic acid, phthalic acid and trimellitic acid.

3. The method according to claim 1, wherein the water is derived from a hydrate of the metal salt.

4. The method according to claim 1, wherein the metal salt of the metal salt-containing composition is a salt of one or more metals selected from a group consisting of Mg, Ca, Sr, Ba, Y, Ti, Zr, Hf, Nb, Ta, Cr, W, Fe, Ni, Cu, Ag, Zn, Al, Ga, In, Sn and Sb.

5. The method according to claim 1, wherein the metal salt of the metal salt-containing composition is a metal salt with at least Zn therein.

6. The method according to claim 5, wherein the metal salt of the metal salt-containing composition further comprises a salt of one or more metals selected from a group consisting of In and Ga.

7. The method according to claim 1, wherein the metal salt is in a form of one or more salts selected from a group consisting of nitrate, sulfate, carboxylate, halide, alkoxide and acetylacetonate.

8. The method according to claim 1, comprising the steps of:
   (i) forming the gate electrode on a substrate;
   (ii) forming the gate insulating layer on the substrate such that the gate electrode is covered with the gate insulating layer;
   (iii) supplying the metal salt-containing composition on the gate insulating layer to form a channel precursor layer, and then subjecting the channel precursor layer to a heat treatment to form the channel layer therefrom; and
   (iv) forming the source electrode and the drain electrode such that they are in contact with the channel layer.

9. The method according to claim 1, comprising the steps of:
   (i)' providing a metal foil;
   (ii)' forming the gate insulating layer on the metal foil;
   (iii)' supplying the metal salt-containing composition on the gate insulating layer to form a channel precursor layer, and then subjecting the channel precursor layer to a heat treatment to form the channel layer therefrom;
   (iv)' forming the source electrode and the drain electrode such that they are in contact with the channel layer;
   (v)' forming a sealing layer such that the channel layer, the source electrode and the drain electrode are covered with the sealing layer; and
   (vi)' subjecting the metal foil to an etching treatment to form the gate electrode therefrom.

10. The method according to claim 1,
   wherein the metal salt-containing composition is further used for a formation of the gate insulating layer, and
   wherein the metal salt of the metal salt-containing composition to be used for the formation of the gate insulating layer is a salt of one or more metals selected from a group consisting of Ba, Y, Zr, Hf, Ta and Al.

11. The method according to claim 1,
   wherein the metal salt-containing composition is further used for a formation of the source electrode and/or the drain electrode, and
   wherein the metal salt of the metal salt-containing composition to be used for the formation of the source electrode and/or the drain electrode is a salt of an electrically-conductive metal.

12. A field-effect transistor obtained by the manufacturing method according to claim 1, comprising:
   the channel layer;
   the gate electrode;
   the gate insulating layer positioned at least between the channel layer and the gate electrode; and
   the source and drain electrodes located in contact with the channel layer,
   wherein the channel layer comprises a metal oxide formed from the metal salt-containing composition.

13. The field-effect transistor according to claim 12, wherein a surface of the channel layer has an arithmetic mean roughness (Ra) of not more than 10 nm.

14. A field-effect transistor obtained by the manufacturing method according to claim 5, comprising:
   the channel layer;
   the gate electrode;
   the gate insulating layer positioned at least between the channel layer and the gate electrode; and
   the source and drain electrodes located in contact with the channel layer,
   wherein the channel layer comprises a metal oxide formed from the metal salt-containing composition, the metal oxide comprising Zn.

15. A field-effect transistor obtained by the manufacturing method according to claim 6, comprising:
   the channel layer;
   the gate electrode;
   the gate insulating layer positioned at least between the channel layer and the gate electrode; and
   the source and drain electrodes located in contact with the channel layer, wherein the channel layer comprises a metal oxide formed from the metal salt-containing composition, the metal oxide comprising Zn and one or more metals selected from the group consisting of In and Ga.

16. The field-effect transistor according to claim 14, wherein the metal oxide has a density of 4.0 to 5.5 g/cm$^3$.

17. The field-effect transistor according to claim 12, wherein the metal oxide is in an amorphous form.

18. A field-effect transistor obtained by the manufacturing method according to claim 10, comprising:
   the channel layer;
   the gate electrode;
   the gate insulating layer positioned at least between the channel layer and the gate electrode; and
   the source and drain electrodes located in contact with the channel layer,
   wherein the channel layer comprises a metal oxide formed from the metal salt-containing composition, and
   wherein the gate insulating layer comprises a metal oxide formed from the metal salt-containing composition for the formation of the gate insulating layer, the metal oxide of the gate insulating layer being an oxide of one or more metals selected from a group consisting of Ba, Y, Zr, Hf, Ta, Al and Si.

19. A field-effect transistor obtained by the manufacturing method according to claim 11, comprising:
   the channel layer;
   the gate electrode;
   the gate insulating layer positioned at least between the channel layer and the gate electrode; and
   the source and drain electrodes located in contact with the channel layer,
   wherein the channel layer comprises a metal oxide formed from the metal salt-containing composition, and
   wherein the source electrode and/or the drain electrode comprises an electrically-conductive metal oxide formed from the metal salt-containing composition for the formation of the source electrode and/or drain electrode.

20. The field-effect transistor according to claim 12, wherein the field-effect transistor is a thin film transistor (TFT).

21. The method according to claim 1, wherein the channel layer of the field-effect transistor is formed such that a conductance of the channel layer is controlled by an electric field derived from the gate electrode so as to control a flow of current from the source electrode to the drain electrode.

* * * * *